United States Patent
Taneya et al.

(10) Patent No.: US 7,421,000 B2
(45) Date of Patent: Sep. 2, 2008

(54) SEMICONDUCTOR LASER DEVICE

(75) Inventors: Mototaka Taneya, Nara (JP); Yukio Yamasaki, Daito (JP); Shigetoshi Ito, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 50 days.

(21) Appl. No.: 11/704,348

(22) Filed: Feb. 9, 2007

(65) Prior Publication Data

US 2007/0153854 A1    Jul. 5, 2007

Related U.S. Application Data

(63) Continuation of application No. 10/510,324, filed as application No. PCT/JP03/03761 on Mar. 26, 2003, now Pat. No. 7,177,336.

(30) Foreign Application Priority Data

Apr. 4, 2002    (JP)    ............................... 2002-102225

(51) Int. Cl.
   *H01S 5/00*    (2006.01)
(52) U.S. Cl. ............... 372/43.01; 372/45.01; 372/46.01
(58) Field of Classification Search .............. 372/43.01, 372/1
   See application file for complete search history.

(56) References Cited

U.S. PATENT DOCUMENTS

| | | | |
|---|---|---|---|
| 4,328,469 A | 5/1982 | Scifres et al. | |
| 4,706,101 A * | 11/1987 | Nakamura et al. | ............ 257/97 |
| 5,260,959 A | 11/1993 | Hayakawa | |
| 5,619,518 A | 4/1997 | Horie et al. | |
| 6,118,799 A * | 9/2000 | Okubo et al. | ............ 372/46.01 |
| 6,493,367 B1 | 12/2002 | Ito et al. | |
| 6,556,603 B1 | 4/2003 | Yamasaki et al. | |
| 7,092,422 B2 | 8/2006 | Kan | |

FOREIGN PATENT DOCUMENTS

| | | |
|---|---|---|
| EP | 1 018 770 | 7/2000 |
| EP | 1 184 913 | 3/2002 |
| JP | 55-96695 A | 7/1980 |
| JP | 05-110139 | 4/1993 |
| JP | 5235470 | 9/1993 |
| JP | 09-055560 | 2/1997 |
| JP | 11-068158 | 3/1999 |

(Continued)

OTHER PUBLICATIONS

Casey, H.C. Jr. et al. Eds. (1978). *Heterostructure Lasers: Part A Fundamental Principles* Academic Press pp. 42-49.

*Primary Examiner*—Dung T Nguyen
(74) *Attorney, Agent, or Firm*—Morrison & Foerster LLP

(57) ABSTRACT

A semiconductor laser device having a waveguide constructed in a stack of layers including, on a substrate that is transparent and has a refractive index $n_s$ for laser light, a first clad layer of a refractive index $n_{c1}$, a second clad layer of a refractive index $n_{c2}$, a third clad layer of a refractive index $n_{c3}$, a first conductivity type guide layer of a refractive index $n_g$, an active quantum well layer, a second conductivity type guide layer, a second conductivity type clad layer, and a second conductivity type contact layer deposited in that order, wherein the waveguide has an effective refractive index $n_e$, and the relationship $n_{c2} < (n_{c1}, n_{c3}) < n_e < (n_s, n_g)$ is satisfied.

7 Claims, 16 Drawing Sheets

FOREIGN PATENT DOCUMENTS

| | | |
|---|---|---|
| JP | 11-068256 | 3/1999 |
| JP | 11-186659 | 7/1999 |
| JP | 2000-277862 | 10/2000 |
| JP | 2000-299497 | 10/2000 |
| JP | 2001-085796 | 3/2001 |
| JP | 2001-148539 | 5/2001 |
| JP | 2001-298243 | 10/2001 |
| JP | 2001-358407 | 12/2001 |

* cited by examiner

SEMICONDUCTOR LASER DEVICE

REFERENCE TO RELATED APPLICATIONS

This application is a continuation of Ser. No. 10/510,324, filed Oct. 4, 2004, now U.S. Pat. No. 7,177,336, which is a national stage application under 35 USC 371 of International Application No. PCT/JP03/03761, filed Mar. 26, 2003, the entire contents of which are incorporated herein by reference.

TECHNICAL FIELD

The present invention relates to a semiconductor laser device including a substrate having a refractive index larger than an effective refractive index of an optical waveguide formed in the device. The effective refractive index of the optical waveguide is considered in analyzing a guide mode in the waveguide. More specifically, the present invention relates to improvement in stability of a vertical transverse mode in a semiconductor laser device including a plurality of nitride semiconductor ($In_xAl_yGa_{1-x-y}N$, where $0 \leq x$, $0 \leq y$, and $x+y \leq 1$) layers deposited on a GaN substrate for example, and also relates to prevention of cracks in a clad layer included in the semiconductor layers.

For a definition to the effective refractive index of the waveguide, refer to a text book "HETEROSTRUCTURE LASERS" edited by Casey and Panish and published 1978 by ACADEMIC PRESS, pp. 42-49 (p. 49 in particular).

BACKGROUND ART

In recent years, blue light emitting diodes formed of nitride semiconductor have been commercialized and furthermore blue laser diodes have also been in practical utilization.

In FIG. 15, a nitride semiconductor laser device fabricated by conventional art on a GaN substrate is shown in a schematic front view. This laser device includes a 4 μm thick n-type GaN contact layer 802, an n-type $In_{0.08}Ga_{0.92}N$ crack prevention layer 803, a 1.2 μm thick n-type AlGaN clad layer 804 (having a superlattice structure including $Al_{0.14}Ga_{0.86}N$ layers and GaN layers, and having a mixed-crystal composition of $Al_{0.07}Ga_{0.93}N$ as averaged), a 0.075 μm thick n-type GaN guide layer 805, an active quantum well layer 806 (including three pairs of an $In_{0.11}Ga_{0.89}N$ well layer and an $In_{0.01}Ga_{0.99}N$ barrier layer), a p-type $Al_{0.4}Ga_{0.6}N$ electron trapping layer 807, a 0.075 μm thick p-type GaN guide layer 808, a 0.5 μm thick AlGaN clad layer 809 (having a superlattice structure of $Al_{0.1}Ga_{0.9}N$ layers and GaN layers, and having a mixed-crystal composition of $Al_{0.05}Ga_{0.95}N$ as averaged), and a 15 nm thick p-type GaN contact layer 810, sequentially deposited on a GaN substrate 801.

FIG. 16 is a graph showing a radiation pattern in a direction vertical to the active layer (hereinafter referred to as a "vertical radiation pattern") in a far field pattern (FFP) of optical radiation from the FIG. 15 laser device. More specifically, in this graph, a horizontal axis represents the deviation angle (degrees) from a direction parallel to the active layer toward a direction perpendicular to the active layer and a vertical axis represents the optical intensity (a.u.: arbitrary unit). When the substrate is made of a material having a refractive index larger than an effective refractive index of a waveguide as in the FIG. 15 laser device, then in a transverse mode vertical to the active layer (a vertical transverse mode), laser rays having reached the substrate are radiated through the substrate. As shown in FIG. 16, therefore, the FFP includes a noise peak at a direction deviated by about ten and several degrees from an emission direction of a fundamental mode (a direction parallel to the active layer) toward the substrate side (downward). A laser device causing such a noise peak involves a problem in application to optical disks etc. Further, such a noise peak corresponds to radiation loss of waveguide, involving problems of increase of threshold current in the laser device and decrease of differential quantum efficiency in lasing.

On the other hand, when thick (4 μm) n-type $Al_{0.05}Ga_{0.95}N$ contact layer 802 is deposited between GaN substrate 801 and n-type AlGaN clad layer 804 as in the FIG. 15 laser device, the radiation (or leakage) mode to GaN substrate 801 tends to be suppressed. In that case, however, n-type AlGaN clad layer 804 must be formed to have a relatively large thickness of approximately 0.8 μm, and it becomes difficult to completely prevent cracks in its crystal. As a consequence, electric current leakage, increase of threshold current, and decrease of reliability are involved, causing decrease of the laser device yield rate.

Accordingly, a main object of the present invention is to suppress the noise peak in the vertical radiation pattern in such a semiconductor laser device including a substrate having a refractive index larger than an effective refractive index of a waveguide as in the case that a semiconductor laser structure is fabricated on a GaN substrate. Another object of the present invention is to prevent decrease of the nitride semiconductor laser device yield rate attributed to cracks in the n-type clad layer having a relatively large Al composition ratio, and to suppress the noise peak in the vertical radiation pattern.

DISCLOSURE OF THE INVENTION

The present invention provides a semiconductor laser device having a waveguide formed in a stack of layers including a first clad layer having a refractive index $n_{c1}$, a second clad layer having a refractive index $n_{c2}$, a third clad layer having a refractive index $n_{c3}$, a first conductivity type (n-type or p-type) guide layer having a refractive index $n_g$, an active quantum well layer, a second conductivity type (p-type or n-type) guide layer, a second conductivity type clad layer, and a second conductivity type contact layer sequentially deposited on a transparent substrate having a refractive index $n_s$ for laser light, wherein the waveguide has an effective refractive index $n_e$ satisfying a relationship: $n_{c2} < (n_{c1}, n_{c3}) < n_e < (n_s, n_g)$.

More specifically, according to the present invention, in the case of using a substrate having a refractive index $n_s$ larger than an effective refractive index $n_e$ in a waveguide region, a clad layer provided between the substrate and an active layer is divided into at least three layers and among the three clad layers a clad layer having the smallest refractive index is arranged between the other clad layers to reduce optical radiation into the substrate. In particular, for a gallium nitride semiconductor laser device using a nitride semiconductor substrate such as a GaN substrate or an AlGaN substrate, the present invention can prevent cracks in a clad layer of Al containing nitride semiconductor and can also suppress a radiation (or leakage) mode to the substrate, whereby significantly increasing the laser device yield rate.

BEST MODES FOR CARRYING OUT THE INVENTION

The present invention is applicable to a semiconductor laser device utilizing any material, which includes a transparent substrate having a refractive index larger than an effective refractive index of its waveguide. More specifically, it is preferable to apply the present invention to a nitride semiconductor laser device including a GaN or AlGaN substrate, or an AlGaInAsP semiconductor laser device including a GaAs substrate, with a view to ensuring reliability of the device.

Figure 1:
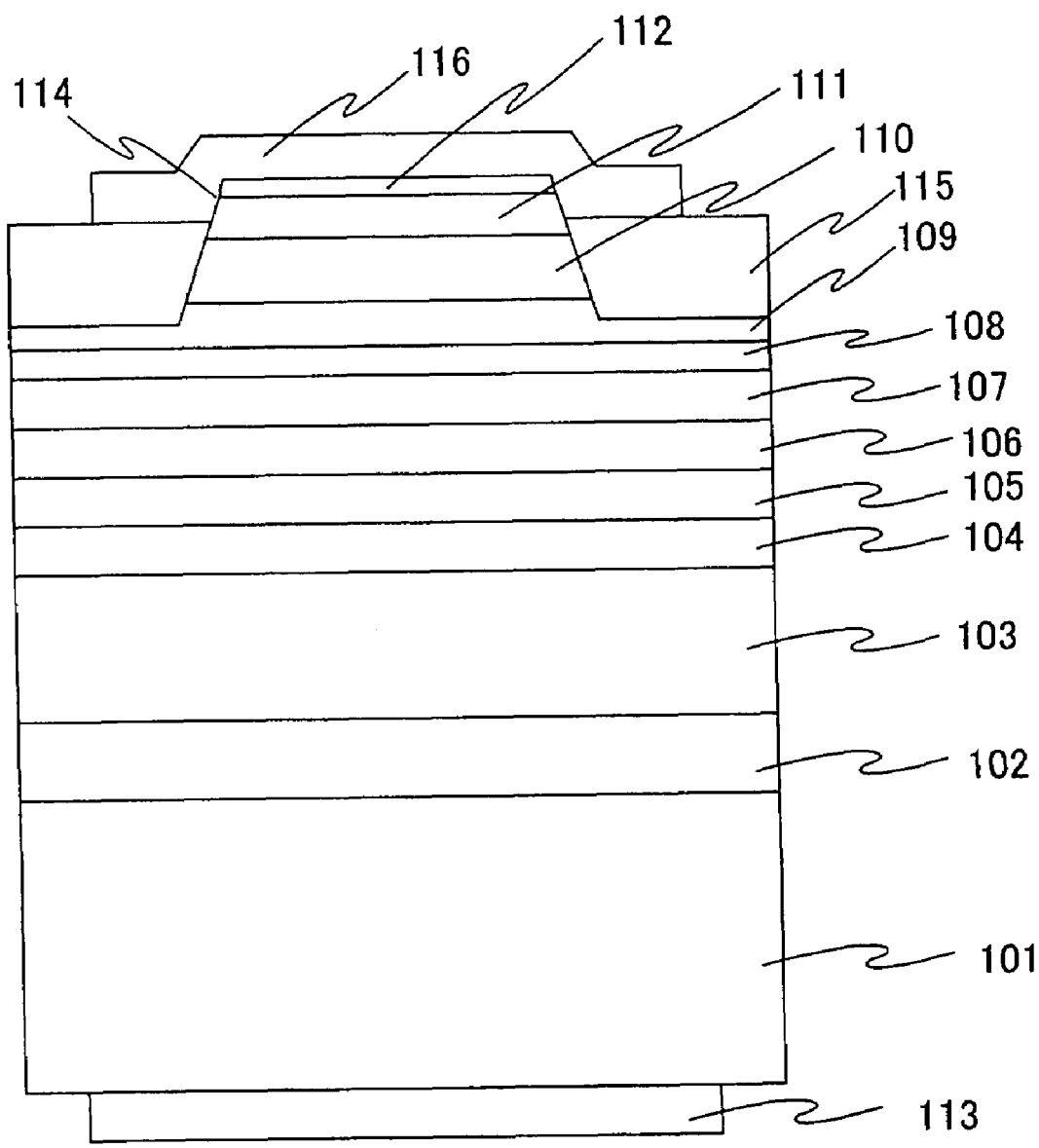
FIG. 1 is a schematic front view of a semiconductor laser device according to a first embodiment of the present invention.

FIG. 1 shows, as one preferable application of the present invention, a nitride semiconductor laser device including a nitride semiconductor substrate 101 and an active layer 107, between which a first $Al_{xc1}Ga_{1-xc1}N$ clad layer 103, a second $Al_{xc2}Ga_{1-xc2}N$ clad layer 104, a third $Al_{xc3}Ga_{1-xc3}N$ clad layer 105 and a first conductivity type guide layer 106 are stacked in this order from the substrate side. Note that among these semiconductor layers, at least one layer may have the element N partially substituted with As, P, and/or Sb. In this case, however, the element N desirably has its composition ratio of at least 0.9 in the group V elements, with a view to obtaining good compositional uniformity and high crystal quality in the layer. Furthermore, any of the first to third clad layers may have In added thereto at a composition ratio within a range of 0.01 to 0.05. In this case, the clad layer crystal can be grown at a lower temperature, and then the grown crystal becomes softer, bringing about an effect of further reducing the cracks.

While substrate 101 can be made of nitride semiconductor, it is most preferably made of GaN. In general, a GaN substrate has higher crystal quality as compared to other nitride semiconductor substrates and thus is preferably used to obtain a reliable semiconductor laser device. In particularly, when the GaN substrate is made to have n-type conductivity, an electrode can be formed on a back surface of the substrate, which is preferable with a view to reducing size of a semiconductor laser chip. AlGaN other than GaN can also be used as a material for the substrate. In this case, however, the Al composition ratio is desirably at most 0.02 in group III elements, with a view to preventing the substrate from cracking.

Other than a substrate made only of nitride semiconductor, the present invention can also employ a pseudo nitride semiconductor substrate including a substrate of a different type and an overlying nitride semiconductor layer. If for such a pseudo nitride semiconductor substrate, local crystal growth control films of $SiO_2$ or the like are used to utilize lateral growth of a nitride semiconductor layer to reduce dislocation density, i.e., epitaxial lateral over growth (ELOG) is employed, then the overlying nitride semiconductor layer contains the local films of $SiO_2$ or the like. Note that the present invention is preferably applicable also to a laser device having a pseudo nitride semiconductor substrate which includes a nitride semiconductor layer having a thickness of at least 10 µm and having a refractive index larger than an effective refractive index $n_e$ of a waveguide formed in the device, since such a laser device causes a significant noise peak in the vertical radiation pattern as described above (see FIG. 16).

As shown in FIG. 1, an underlying layer 102 may be inserted between first clad layer 103 and substrate 101. Underlying layer 102 can be made of n-type GaN. Underlying layer 102 of n-type GaN is preferred, since it can reduce negative effects attributed to unevenness, scratches and the like on the surface of GaN substrate 101 and can contribute to reducing crystal defects in clad layer 103. Although underlying layer 102 can alternatively be made of n-type AlGaN, the Al composition ratio of underlying layer 102 is desirably at most 0.02 in the group III elements, with a view to reducing negative effects of unevenness, scratches and the like on the surface of substrate 101.

First clad layer 103 can be made of a nitride semiconductor having a refractive index smaller than effective refractive index $n_e$ of the waveguide. For example, first clad layer 103 can be made of n-type $Al_{xc1}Ga_{1-xc1}N$, wherein the Al composition ratio $x_{c1}$ is selected so that the layer can have a refractive index smaller than $n_e$. More specifically, when the Al ratio of the mixed-crystal in the AlGaN material having a refractive index equal to $n_e$ is represented by $x_{ne}$, it is necessary to satisfy $x_{ne} < x_{c1}$. On the other hand, it is preferable to satisfy $x_{c1} \leq 0.07$, with a view to reducing fine cracks in the crystal of the first clad layer 103. More preferably, when $x_{c1} \leq 0.05$ is satisfied, it is possible to reduce laser light radiation into substrate 101 and reduce the vertical spread angle of FFP to 26° or less, and it becomes possible to increase the optical coupling coefficient in coupling the semiconductor laser device with an optical system.

Second clad layer 104 can be made of a nitride semiconductor having a refractive index smaller than that of first clad layer 103. For example, second clad layer 104 can be made of n-type $Al_{xc2}Ga_{1-xc2}N$, wherein the Al composition ratio is selected to satisfy $x_{ne}<x_{c1}<x_{c2}$, preferably in a range of $0.06 \leq x_{c2} \leq 0.3$. More specifically, when the Al composition ratio $x_{c2}$ is smaller than 0.06, the light amount trapped in active layer 107 is decreased, leading to increase in the threshold current of the laser device. On the other hand, when $x_{c2}$ is larger than 0.3, cracks are liable to occur in second clad layer 104 and then the laser device cannot be reliable.

Third clad layer 105 can be made of a nitride semiconductor having a refractive index larger than that of the second clad layer 104 and smaller than effective refractive index $n_e$ of the waveguide, whereby increasing effective refractive index $n_e$ of the waveguide as compared to the case that third clad layer 105 is not provided. More specifically, third clad layer 105 can be made of n-type $Al_{xc3}Ga_{1-xc3}N$, wherein the Al composition ratio is selected to satisfy $x_{ne}<x_{c3}<x_{c2}$. On the other hand, it is preferable to satisfy $x_{c1} \leq 0.07$, with a view to reducing fine cracks in the crystal of third clad layer 105.

When first, second and third clad layers 103, 104, 105 have thicknesses $d_{c1}$, $d_{c2}$, $d_{c3}$, respectively, with $d_{c2}<d_{c1}$ and $d_{c3}<d_{c1}$ being set, the leakage mode into substrate 101 can effectively be prevented and the second clad layer having the largest Al composition ratio can have thickness $d_{c2}$ reduced so as to reduce the cracks. Second clad layer 104 preferably has a thickness in a range of $0.05\ \mu m \leq d_{c2} \leq 0.35\ \mu m$. In the case of $0.05>d_{c2}$, second clad layer 104 loses contribution to the light trapping effect, leading to increase of the threshold current. In the case of $d_{c2}>0.35\ \mu m$, on the other hand, the FFP's vertical full angle at half maximum is increased to be larger than 26°, leading to reduction of the optical coupling coefficient in coupling the laser device with a lens. Furthermore, in the case of $d_{c2}>0.35\ \mu m$, crystal cracks are liable to occur in the three clad layers, leading to reduction in the laser device yield rate.

Three clad layers 103, 104, 105 together preferably have a total thickness $d_t=d_{c1}+d_{c2}+d_{c3}$ of 4.5 μm or less. In the case of total thickness $d_t$ exceeding 4.5 μm, even if the cracks are suppressed until all semiconductor layers are grown on the substrate, subsequent heat treatments for activation of p-type impurities and alloying of an electrode cause the crystal cracks. In the case that total thickness $d_t$ is smaller than 1.4 μm, on the other hand, the effect of suppressing the leakage mode into substrate 101 is reduced, causing laser loss.

First, second and third clad layers 103, 104, 105 are not restricted regarding their conductivity type. In the case that at least one of the layers is of p-type conductivity or insulative, however, an n-type electrode must be formed on a surface of an n-type layer existing closer to active layer 107 than the p-type or insulative clad layer. In the case that at least one clad layer is an undoped layer, on the other hand, it is possible to reduce laser absorption loss attributed to absorption caused by free carriers. In the case that three clad layers 103, 104, 105 are all made of n-type semiconductor, the n-type electrode can be formed on substrate 101, whereby making it possible to form the electrode through a simplified process and reduce contact resistance of the electrode. Furthermore, by making substrate 101 as well as the three clad-layers have n-type conductivity, it becomes possible to form the n-type electrode on a back surface of substrate 101, whereby making it possible to reduce size of a laser chip and package the chip through a simplified process.

It is not necessary that three clad layers 103, 104, 105 are in contact with each other. A thin layer of InGaN, GaN or InGaAlN may be inserted between first and second clad layers 103 and 104 or between second and third clad layers 104 and 105. In the case that such a thin layer is inserted, the thin layer desirably has a thickness (corresponding to a distance between the first and second clad layers or between the second and third clad layers) set to be one fourth or less of a wavelength of laser light in the waveguide and desirably has a thickness of 0.04 μm or less for a bluish violet laser of nitride semiconductor.

Furthermore, a strain alleviation layer of InGaN (not shown) may be inserted between first clad layer 103 and nitride semiconductor substrate 101 or underlying layer 102. The strain alleviation layer can have a thickness selected in a range of 0.02 μm to 0.06 μm. If the thickness is smaller than 0.02 μm, the layer can not cause the effect of alleviating strain. If the thickness is larger than 0.06 μm, on the other hand, the strain alleviation layer is liable to include pits formed therein and then semiconductor layers grown thereon are liable to have impaired crystallinity. Furthermore, the strain alleviation layer desirably has an In composition ratio of at least 0.03 and at most 0.12. If the In composition ratio is smaller than 0.03, the layer can not cause the effect of alleviating strain. If the In composition ratio is larger than 0.12, the layer is liable to include pits formed therein and then the semiconductor layers grown thereon are liable to have impaired crystallinity. It is preferable to introduce the strain alleviation layer, because the layer can significantly cause the effect of alleviating strain when the first to third clad layers deposited thereon have $(d_{c1} \times x_{c1} + d_{c2} \times x_{c2} + d_{c3} \times x_{c3})$ exceeding 0.15 μm.

Furthermore, at least one of the first, second and third clad layers may have a multi-layer structure. In a specific example of the multi-layer structure, an AlGaN layer having a thickness of 0.1 μm and an Al composition ratio of 0.1 can be replaced with a 20 nm thick $Al_{0.2}Ga_{0.8}N$ layer and a 20 nm thick GaN layer alternately repeated 25 times. Although it is possible to select an Al composition ratio, a thickness and the like as desired for each layer in the multi-layer structure, when each layer has a thickness $d_i$ and an Al composition ratio $x_i$, the average Al composition ratio of $\Sigma(d_i \cdot x_i)/\Sigma(d_i)$ must satisfies the above described condition for the clad layer.

First conductivity type guide layer 106 can be made of a nitride semiconductor having a refractive index larger than the waveguide's effective refractive index $n_e$. For example, guide layer 106 can be made of n-type GaN or n-type InGaN, and it preferably has a thickness of at least 0.03 μm and at most 0.2 μm. When the thickness of guide layer 106 is smaller than 0.03 μm or larger than 0.2 μm, the effect of trapping light in active layer 107 is reduced and the threshold current of the laser device is increased. Furthermore, when n-type guide layer 106 is made with an InGaN material, it is preferable to select its In composition ratio in a range of 0.01 to 0.1. In the case of the In composition ratio exceeding 0.1, efficiency of electron injection into active layer 107 is reduced and the laser device's threshold current is increased.

Active layer 107 can have a single quantum well structure formed of InGaN or a multiple quantum well structure including more than one pair of a quantum well layer of InGaN and a barrier layer of GaN, InGaN, or AlGaInN. In particular, by utilizing the multiple quantum well structure including the barrier layer of InGaN, light amount trapped in active layer 107 can be increased and the laser device's threshold current can be reduced. Furthermore, by selecting the number of quantum wells in a range of 2 to 5 in active multiple quantum well layer 107, the laser device's threshold current can be reduced. Furthermore, when active multiple quantum well layer 107 has a total thickness of at least 0.04 μm and at most 0.08 μm, the laser device's threshold current can be reduced. Furthermore, when active layer 107 has a thickness of at least 0.04 μm and at most 0.06 μm, it is possible to make the vertical laser radiation angle smaller than 24°. Active layer 107 may be doped with Si, Sn, Se, Te or the like. In particular, when active layer 107 is doped with Si in a range of $1\times10^{17}$ cm$^{-3}$ to $5\times10^{18}$ cm$^{-3}$ it is possible to maximize the differential gain and reduce the threshold current in the laser device.

A plurality of semiconductor layers over active layer 107 need to form a stacked layer structure which can simultaneously implement a hetero structure trapping carriers in active layer 107 and a waveguide structure trapping light in active layer 107. For example, a p-type protection layer 108, a p-type guide layer 109, a p-type clad layer 110, and a p-type contact layer 111 deposited in this order over active layer 107, and then a ridged stripe structure is formed with at least p-type clad layer 110 and p-type contact layer 111.

P-type protection layer 108 can be made of a nitride semiconductor having a barrier height of its conduction band higher by at least 0.3 eV as compared to active layer 107. For example, p-type protection layer 108 can be made of p-type AlGaN doped with Mg, and it preferably has an Al composition ratio of at least 0.1 and at most 0.45. When the Al composition ratio is smaller than 0.1, the barrier height for electrons is reduced, so that electrons cannot effectively be trapped in active layer 107 and overflow into p-type layers, thereby increasing the laser device's threshold current. In the case of the Al composition ratio exceeding 0.45, on the other hand, it becomes difficult to activate the added Mg, so that the effective barrier height for electrons is reduced. More preferably, an Al composition ratio of at least 0.3 and at most 0.45 can be selected to ensure that the laser device reliably operates at a high temperature (of 70° C. or more). P-type protection layer 108 preferably has a thickness of at least 5 nm and at most 30 nm. When the thickness is smaller than 5 nm, the layer loses uniformity and partially allows an overflow of electrons from active layer 107 to p-type layers. When the thickness is larger than 30 nm, on the other hand, protection layer 108 gives an increased crystal strain effect to active layer 107 and the laser device's threshold current is increased.

Second conductivity type guide layer 109 can be made of a nitride semiconductor having a refractive index larger than $n_e$. For example, guide layer 109 can be made of Mg added p-type GaN, InGaN or InGaAlN, and it preferably has a thickness of at least 0.03 μm and at most 0.2 μm. When the thickness is smaller than 0.03 μm or larger than 0.2 μm, the effect of trapping light in active layer 107 is reduced and the threshold current of the laser device is increased. Furthermore, when InGaN or InGaAlN is used for second conductivity type guide layer 109, it is preferable to select its In composition ratio in a range of 0.01 to 0.1. In the case of the In composition ratio exceeding 0.1, efficiency of electron injection into active layer 107 is reduced and the laser device's threshold current is increased.

Second conductivity type clad layer 110 can be made of a nitride semiconductor having a refractive index smaller than $n_e$. For example, clad layer 110 can be made of Mg added p-type AlGaN and it preferably has an Al composition ratio of at least 0.06 and at most 0.2. When the Al composition ratio is smaller than 0.06, active layer 107 less effectively traps light and the laser device's threshold current is increased. In the case of the Al composition ratio exceeding 0.2, p-type conductance due to the addition of Mg is reduced and the laser device's lifetime is reduced. P-type clad layer 109 preferably has a thickness of at least 0.25 μm and at most 1.5 μm. When the thickness is smaller than 0.25 μm, a significant part of laser light is absorbed by a p-type electrode 112, leading to increase loss at the waveguide. When the thickness is larger than 1.5 μm, the clad layer's resistance is increased and the laser device's lifetime is reduced. More preferably, the thickness can be selected in a range of 0.35 μm to 0.75 μm to reduce the cracks and also make it possible to form a ridged stripe of a width as small as 1 to 2 μm.

Second conductivity type contact layer 111 is made of a nitride semiconductor that can establish an ohmic contact with second conductivity type electrode 112. For example, contact layer 111 can be made of Mg added p-type GaN and can also be made of a material including In added thereto in a composition ratio range of 0.01 to 0.15. With contact layer 111 of such a material, it is possible to increase hole density as compared to that of GaN, whereby making it possible to reduce contact resistance of second conductivity type electrode 112. Second conductivity type contact layer 111 preferably has a thickness of at least 0.06 μm and at most 0.2 μm. When the thickness is smaller than 0.06, the layer can no longer serve as a contact layer to establish low-resistance contact with second conductivity type electrode 112. In contrast, when second conductivity type contact layer 111 having a refractive index larger than n has a thickness larger than 0.2 μm, then in addition to the waveguide with active layer 107 serving as a core, a secondary waveguide with contact layer 111 serving as a core is formed, so that laser light is coupled with the secondary waveguide too thereby causing output loss.

Before a semiconductor stacked-layer structure is formed on nitride semiconductor substrate 101, the substrate may have its surface etched. The nitride semiconductor substrate sometimes includes unevenness on its surface, depending on the method of forming the same. In such a case, by etching the substrate surface to make it flat and then depositing underlying layer 102, first clad layer 103 and the like thereon, it becomes possible to improve crystallinity of the semiconductor stacked-layer structure.

In the present invention, crystal growth of nitride semiconductor layers can be carried out by metal-organic vapor phase epitaxy (MOVPE), metal-organic chemical vapor deposition (MOCVD), halide vapor phase epitaxy (HVPE), molecular beam epitaxy (MBE) or any other similar technique that can grow the nitride semiconductor layers.

First Embodiment

As a first embodiment, a process of fabricating the FIG. 1 nitride semiconductor laser device will be described. Initially, n-type GaN underlying layer 102 of 3 μm thickness is grown on n-type GaN substrate 101 at 1125° C., using hydrogen as a carrier gas, trymethylgallium (TMG) and ammonium as source gases, and silane (SiH$_4$) as a dopant gas.

Then, at the same substrate temperature, hydrogen serving as a carrier gas, trymethy aluminum (TMA), TMG and ammonium serving as source gases, and silane serving as a dopant gas are used to grow first n-type clad layer 103 of Al$_{0.05}$Ga$_{0.95}$N doped with Si at a concentration of $3\times10^{18}$ cm$^{-3}$ to have a thickness of 1.8 μm. Similarly, second n-type clad layer 104 of Al$_{0.1}$Ga$_{0.9}$N doped with Si at a concentration of $3\times10^{18}$ cm$^{-3}$ is grown to a thickness of 0.2 μm. Similarly, third n-type clad layer 105 of Al$_{0.05}$Ga$_{0.95}$N doped with Si at a concentration of $3\times10^{18}$ cm$^{-3}$ is grown to a thickness of 0.1 μm.

Then, at the same substrate temperature, hydrogen serving as a carrier gas, TMG and ammonium serving as source gases, and silane serving as a dopant gas are used to grow n-type guide layer 106 of GaN doped with Si at a concentration of $8\times10^{17}$ cm$^{-3}$ to have a thickness of 0.08 μm.

Then, at the substrate temperature reduced to 760° C., and nitrogen or argon serving as a carrier gas, TMG and ammonium serving as source gases, and silane serving as a dopant gas are used to grow a barrier layer of GaN doped with Si at a concentration of $2\times10^{18}$ cm$^{-3}$ to have a thickness of 12 nm. Subsequently, the silane gas is stopped and TMG is introduced to grow an undoped In$_{0.11}$Ga$_{0.89}$N well layer to a thickness of 4 nm. These barrier and well layers are repeatedly formed three times and thereafter a final barrier layer is deposited to complete active layer 107 having a multiple quantum well structure (MQW) of 60 nm thickness in total.

Then, at the same substrate temperature, hydrogen serving as a carrier gas, TMA, TMG and ammonium serving as source gases, and further cyclopentadienylmagnesium (Cp$_2$Mg) serving as a dopant gas are used to grow p-type protection layer 108 of Al$_{0.4}$Ga$_{0.6}$N containing Mg at a concentration of $1\times10^{19}$ cm$^{-3}$ to have a thickness of 20 nm.

Then, at the substrate temperature raised to 1035° C., nitrogen serving as a carrier gas, TMG and ammonium serving as source gases, and Cp$_2$Mg serving as a dopant gas are used to grow p-type guide layer 109 of GaN containing Mg at a concentration of $2\times10^{19}$ cm$^{-3}$ to have a thickness of 0.08 µm.

Then, at the same substrate temperature, nitrogen serving as a carrier gas, and TMA, TMG and ammonium serving as source gases are used to grow an undoped Al$_{0.1}$Ga$_{0.09}$N layer A to a thickness of 2.5 nm and then TMA is stopped and Cp$_2$Mg is used as a dopant gas to grow a layer B of GaN doped with Mg at a concentration of $3\times10^{19}$ cm$^{-3}$ to have a thickness of 2.5 nm. Layers A and B are alternately deposited repeatedly 100 times to complete p-type clad layer 110 including a multilayer film (a superlattice structure) having a total thickness of 0.5 µm.

Then, at the same substrate temperature, nitrogen serving as a carrier gas, TMG and ammonium serving as source gases, and Cp$_2$Mg serving as a dopant gas are used to grow p-type contact layer 111 of GaN doped with Mg at a concentration of $1.5\times10^{20}$ cm$^{-3}$ to have a thickness of 60 nm.

A wafer including a plurality of semiconductor layers thus grown is cooled approximately to a room temperature and taken out from the deposition chamber, and then p-type electrode layer 112 made of palladium/molybdenum/gold is deposited on p-type contact layer 111. Then, a resist mask is formed in a stripe (not shown) on p-type electrode layer 112 and reactive ion etching (RIE) is utilized to form a ridged stripe 114. More specifically, Ar gas is used to etch p-type electrode 112 and then a gaseous mixture of Ar, Cl$_2$ and SiCl$_4$ is used to etch from p-type contact layer 111 to some extent of p-type clad layer 110 or to some extent of p-type guide layer 109, thereby forming ridged stripe 114 having a bottom side of 1.6 µm width and a top surface of 1.3 µm width on p-type electrode 112.

Furthermore, with the resist being left on ridged stripe 114, the wafer's top surface is covered with an insulating film 115 (herein, a Zr oxide mainly made of ZrO$_2$) grown to a thickness of 0.5 µm. Thereafter, the resist is removed to expose the top side of ridged stripe 114.

Then, n-type GaN substrate 101 has its back surface ground and polished to have a thickness of 110 µm. Thereafter, an n-type electrode 113 is formed on the back surface of the substrate and alloying of the electrode is carried out at 530° C. for about 2 minutes. Then, a p-type pad electrode 116 made of molybdenum and gold is formed to cover p-type electrode 112 and insulating film 115 at least in the vicinity of either side of the electrode. Then, broken-line scribing is employed to form cavity's end surfaces with cleavage planes of the wafer and thereafter chip division is carried out to produce semiconductor laser devices. Incidentally, the cavity preferably has a length in a range of 180 to 850 µm.

The obtained laser device is die-bonded to a heat sink and p-type pad electrode 116 is wire-bonded. The laser devise is energized to lase at a room temperature, and continuous lasing is confirmed with a threshold current of 2.5 kAcm$^{-2}$, a threshold voltage of 4.3V and an emission wavelength of 405 nm. Furthermore, the laser device having its lifetime of at least 30,000 hours at 70° C. is obtained with a yield rate of 83%.

Figure 2:
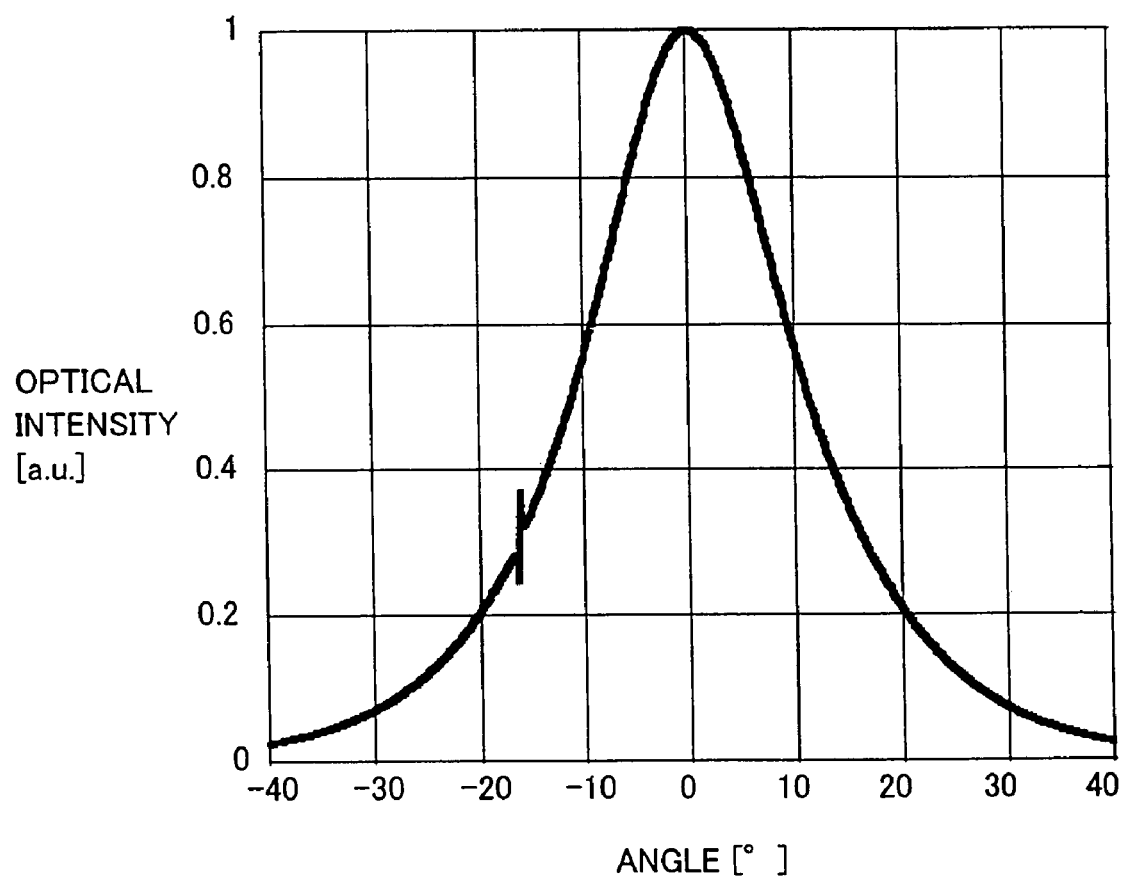
FIG. 2 is a graph showing an optical intensity profile of a vertical radiation pattern of the FIG. 1 semiconductor laser device.
Figure 16:
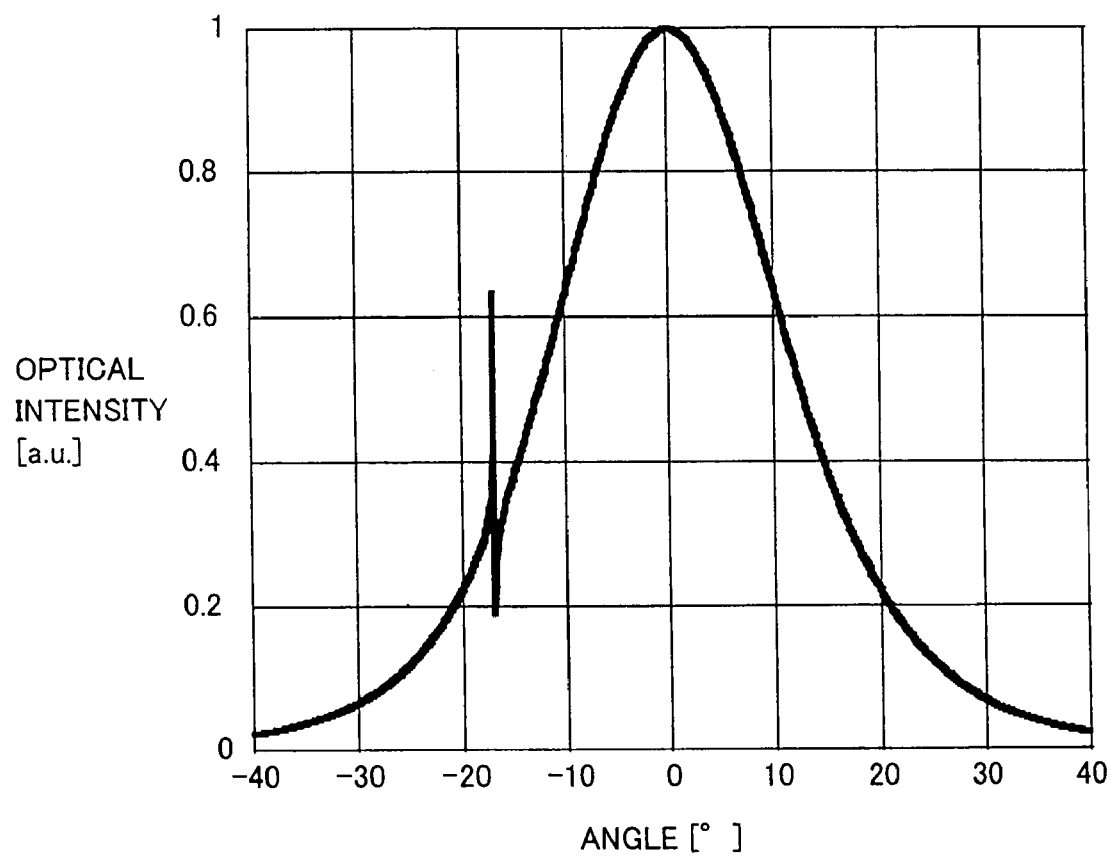
FIG. 16 is a graph showing an optical intensity profile of a vertical radiation pattern of the semiconductor laser device provided by the conventional art.

FIG. 2 shows an optical intensity profile of a vertical radiation pattern in an FFP of the laser device of the first embodiment. In FIG. 2, such a noise peak as shown in FIG. 16 attributed to a conventional leakage mode is reduced to a significant extent which does not cause a problem when the laser device is applied to an optical disk apparatus for example. Incidentally, the plurality of semiconductor layers in the first embodiment do not include observable cracks. Furthermore, the full angle at half maximum of the vertical radiation pattern in the FFP in the first embodiment can be reduced to 22.5° (see FIG. 2), and thus it has a small ratio of 2.1 relative to 10.5° of the full angle at half maximum of the horizontal radiation pattern in the same FFP. With the laser device of the first embodiment, therefore, it is possible to improve efficiency of using laser light in collecting the laser light by a lens.

Second Embodiment

Figure 3:
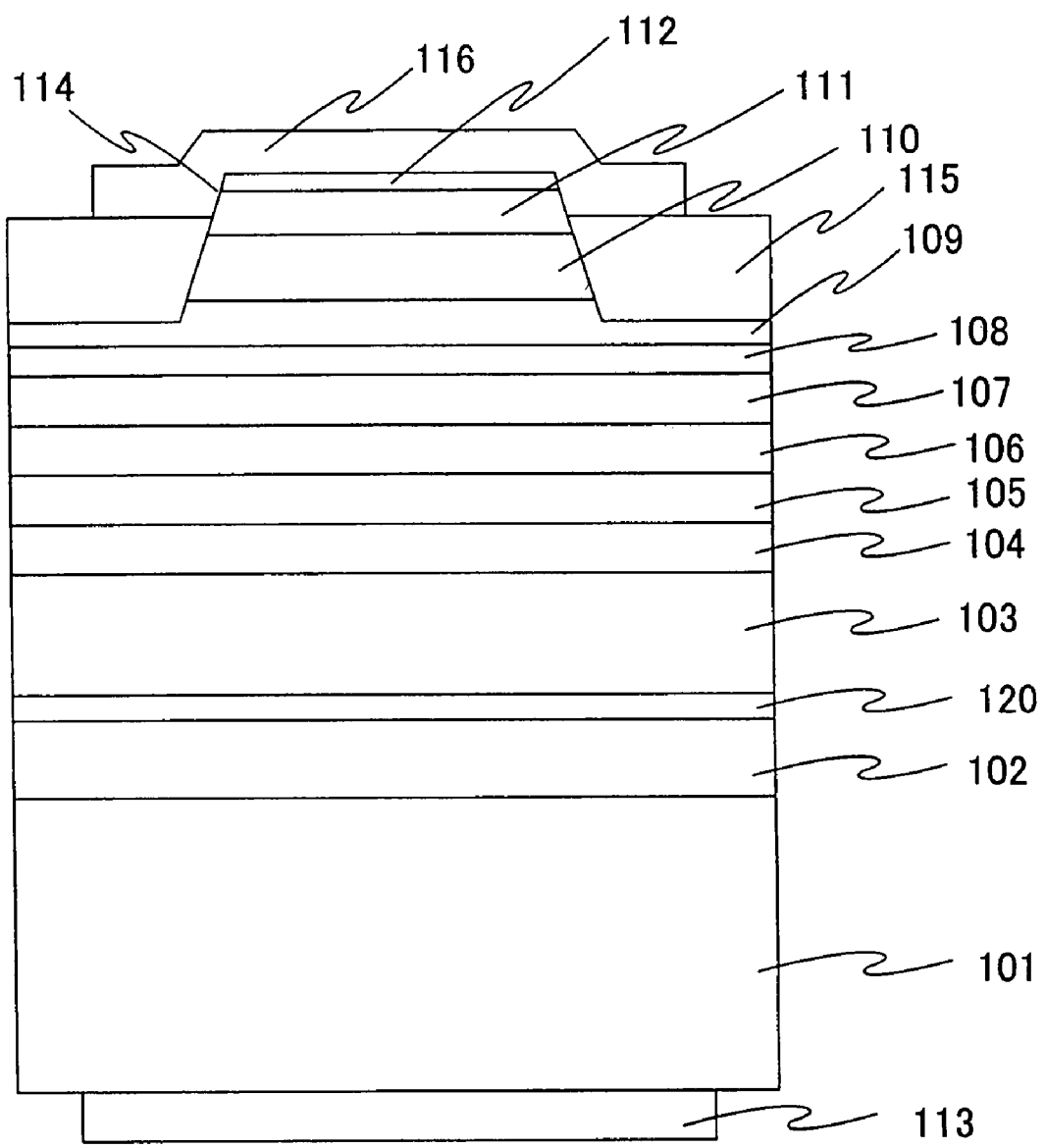
FIG. 3 is a schematic front view of a semiconductor laser device according to a second embodiment of the present invention.

FIG. 3 is a schematic front view of a laser device according to a second embodiment. As seen from FIG. 3 in comparison with FIG. 1, the second embodiment provides a laser device different from the first embodiment only in that a strain alleviation layer 120 is inserted between n-type underlying layer 102 and first n-type clad layer 103. Strain alleviation layer 120 can be made of n-type In$_{0.09}$Ga$_{0.91}$N for example.

More specifically, at a substrate temperature of 800° C., a gaseous mixture of nitrogen of 95% and hydrogen of 5% serving as a carrier gas, TMG, TMI and ammonium serving as source gases, and further, silane serving as a dopant gas can be used to form n-type In$_{0.09}$Ga$_{0.91}$N strain alleviation layer 120 doped with Si at a concentration of $5\times10^{18}$ cm$^{-3}$ to have a thickness of 0.03 µm.

The second embodiment provides an increased yield rate of 94% of the laser device which shows similar characteristics as in the first embodiment.

Third Embodiment

A third embodiment provides a laser device different from the first embodiment only in that dielectric layer 115 shown in FIG. 1 is replaced with a high-resistance or n-type AlGaN layer. Such a laser device of the third embodiment can bring about similar effects as in the first embodiment. The AlGaN layer can be deposited for example by MOVPE, MOCVD, HVPE, MBE, or other similar crystal growth technique. Furthermore, if sputtering is employed to deposit the AlGaN layer, the substrate's temperature can be set to 700° C. or less, which is lower than that for crystal growth, and this is preferable with a view to preventing thermal degradation of active layer 107.

Furthermore, the AlGaN layer preferably has an Al composition ratio higher than that of p-type clad layer 110 so as to realize a steady transverse mode up to a high output. Furthermore, if the Al composition ratios of the AlGaN layer and p-type clad layer 110 are made equal and the etching for forming ridged strip 114 is carried out to reach p-type guide layer 109, it is possible to realize a steady transverse mode up to a high output and effectively prevent leak current associated with cracks in the AlGaN layer.

Fourth Embodiment

Figure 4:
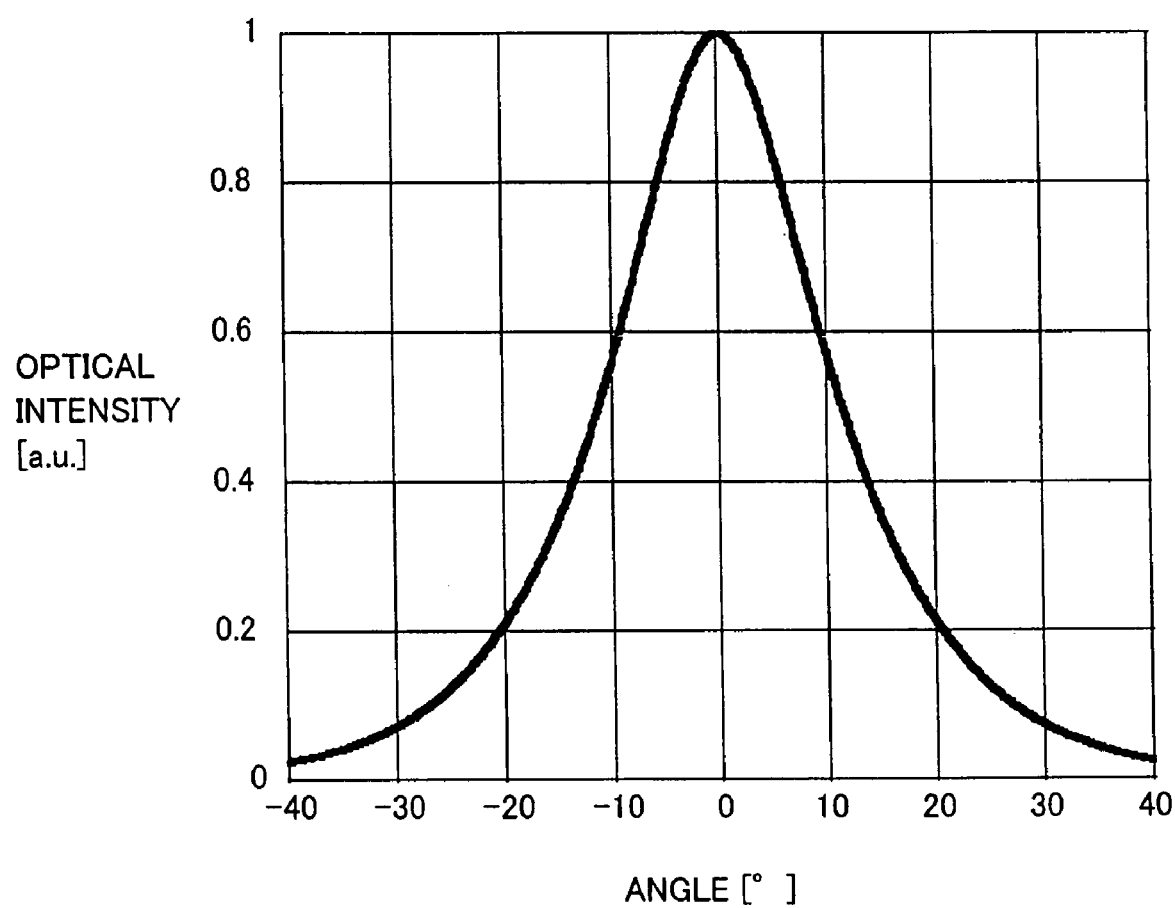
FIG. 4 is a graph showing an optical intensity profile of a vertical radiation pattern of a semiconductor device according to a fourth embodiment of the present invention.

A fourth embodiment provides a laser device different from the first embodiment only in that $x_{c1}=0.038$ and $d_{c1}=3.3$ µm are set in the conditions regarding first clad layer 103. FIG. 4 shows a vertical radiation pattern in an FFP of the laser device of the fourth embodiment. As seen in FIG. 4, the present embodiment substantially completely prevents a noise peak in the vertical radiation pattern in the FFP (see also FIG. 16), with the full angle at half maximum of the vertical radiation pattern being as small as 22°, thereby making it possible to obtain the most preferable laser device for its application.

Fifth Embodiment

Figure 5:
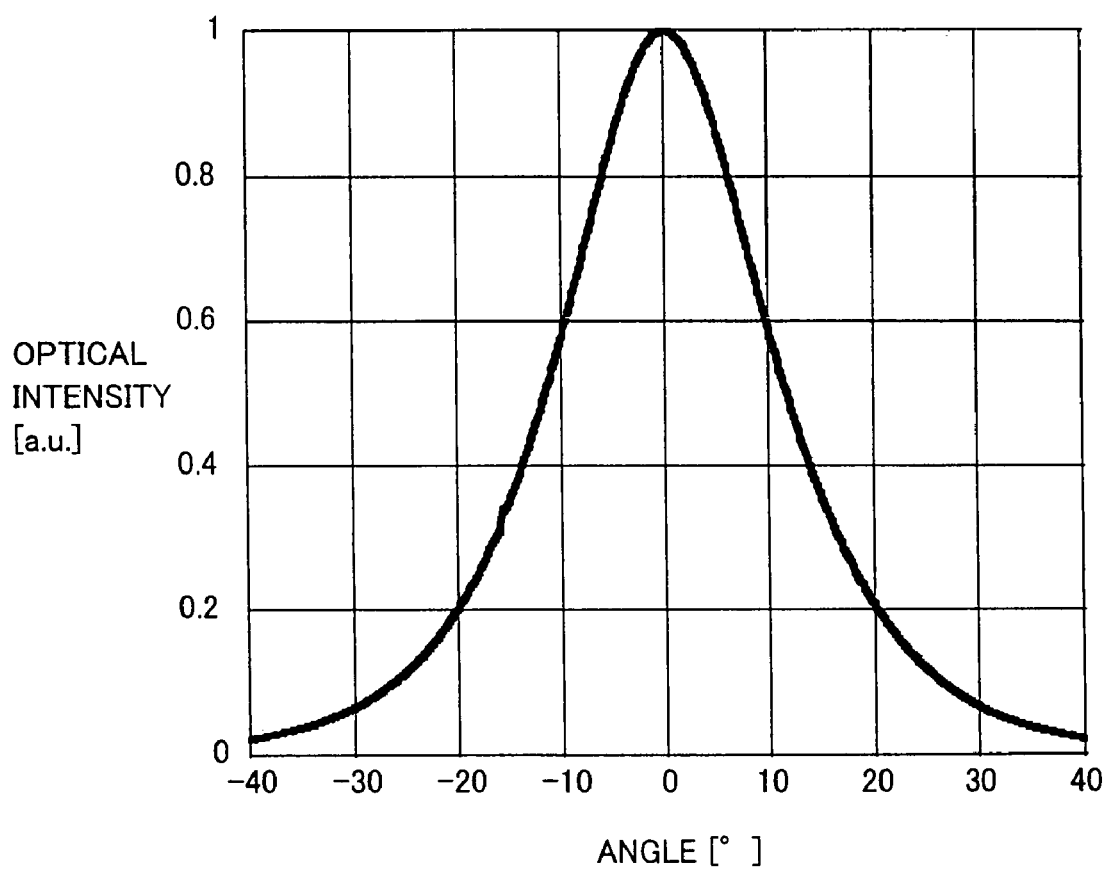
FIG. 5 is a graph showing an optical intensity profile of a vertical radiation pattern of a semiconductor device according to a fifth embodiment of the present invention.

A fifth embodiment provides a laser device different from the first embodiment only in that $x_{c2}=0.07$ and $d_{c2}=0.35$ µm are set in the conditions regarding second clad layer 104. FIG. 5 shows a vertical variation pattern in an FFP of the laser device of the fifth embodiment. As see in FIG. 5, the present embodiment can also significantly prevent a noise peak in the vertical radiation pattern, with the full angle at half maximum of the vertical radiation pattern being as small as 23°, thereby making it possible to obtain a satisfactory laser device.

Sixth Embodiment

A sixth embodiment provides a laser device different from the first embodiment only in that $x_{c3}=0.05$ and $d_{c3}=0.05$ µm are set in the conditions regarding third clad layer 105. The sixth embodiment also brings about similar effects as in the fifth embodiment.

Seventh Embodiment

A seventh embodiment provides a laser device different from the first embodiment only in that active quantum well layer 107 is slightly modified. More specifically, the active layer in the seventh embodiment is formed as follows: after n-type guide layer 106 is deposited, the substrate's temperature is set to 800° C., and nitrogen serving as a carrier gas, TMI, TMG and ammonium serving as source gases, and further silane serving as a dopant gas are used to grow a barrier layer of $In_{0.01}Ga_{0.99}N$ doped with Si at a concentration of $5\times10^{17}$ cm$^{-3}$ to have a thickness of 8 nm. Subsequently the silane gas is stopped, and a well layer of undoped $In_{0.11}Ga_{0.89}N$ is grown to a thickness of 3 nm. These barrier and well layers are deposited repeatedly five times and thereafter a final barrier layer is grown to complete active layer 107 including a multiple quantum well structure (MQW) having a total thickness of 63 nm. The seventh embodiment also brings about similar effects as in the fifth embodiment.

Eighth Embodiment

Figure 6:
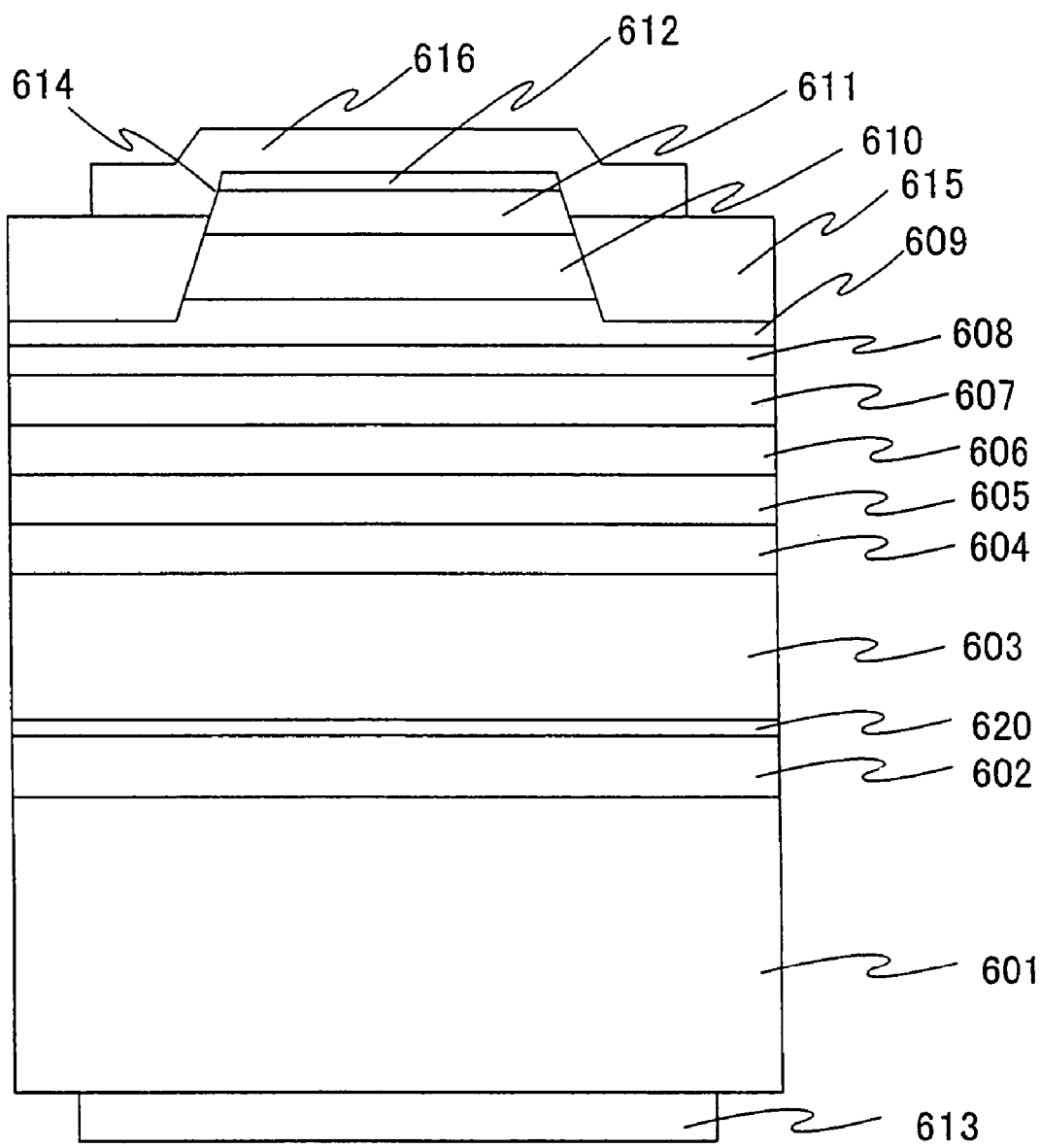
FIG. 6 is a schematic front view of a semiconductor laser device according to an eighth embodiment of the present invention.

FIG. 6 is a schematic front view of an AlGaAs laser device according to an eighth embodiment. This laser device is fabricated as follows: initially, on an n-type GaAs substrate 601 at a temperature of 720° C., hydrogen serving as a carrier gas, TMG and arsine serving as source gases, and silane serving as a dopant gas are used to grow an n-type GaAs underlying layer 602 to a thickness of 0.5 µm.

Then, at the same substrate temperature, hydrogen serving as a carrier gas, TMA, TMG and arsine serving as source gases and furthermore, serving silane as a dopant gas are used to grow a first n-type clad layer 603 of $Al_{0.04}Ga_{0.96}As$ doped with Si at a concentration of $3\times10^{18}$ cm$^{-3}$ to have a thickness of 3.5 µm. Similarly, a second n-type clad layer 604 of $Al_{0.5}Ga_{0.8}As$ doped with Si at a concentration of $2\times10^{18}$ cm$^{-3}$ is grown to a thickness of 0.15 µm, and a third n-type clad layer 605 of $Al_{0.05}Ga_{0.96}As$ doped with Si at a concentration of $1\times10^{18}$ cm$^{-3}$ is grown to a thickness of 0.1 µm. Then, TMA is stopped and an n-type guide layer 606 of GaAs doped with Si at a concentration of $8\times10^{17}$ cm$^{-3}$ is grown to a thickness of 0.12 µm.

Then, at the substrate temperature reduced to 680° C., hydrogen serving as carrier gas, and TMG and arsine serving as source gases are used to grow a barrier layer of undoped GaAs to a thickness of 20 nm. Then, TMA is additionally supplied to grow a well layer of undoped $In_{0.09}Ga_{0.91}As$ to a thickness of 11 nm. These barrier and well layers are repeatedly deposited twice and a final barrier layer is then grown to complete an active layer 607 including a multiple quantum well structure (MQW) having a total thickness of 82 nm.

Then, at the same substrate temperature, hydrogen serving as a carrier gas, TMA, TMG and arsine serving as source gases, and further diethylzinc (DEZn) serving as a dopant gas are used to grow a p-type protection layer 608 of $Al_{0.2}Ga_{0.8}As$ doped with Zn at a concentration of $1.3\times10^{18}$ cm$^{-3}$ to have a thickness of 20 nm.

Then, at the substrate temperature raised to 720° C., hydrogen serving as a carrier gas, TMG and arsine serving as source gases, and DEZn serving as a dopant gas are used to grow a p-type guide layer 609 of GaAs doped with Zn at a concentration of $7\times10^{17}$ cm$^{-3}$ to have a thickness of 0.12 µm. Then, at the same substrate temperature, hydrogen serving as a carrier gas, TMA, TMG and arsine serving as sources gases, and DEZn serving as a dopant gas are used to grow a p-type clad layer 610 of $Al_{0.2}Ga_{0.8}As$ doped with Zn at a concentration of $1.6\times10^{18}$ cm$^{-3}$ to have a thickness of 1.5 µm.

Then, at the same substrate temperature, nitrogen serving as a carried gas, TMG and ammonium serving as source gases, and DEZn serving as a dopant gas are used to grow a p-contact layer 611 of GaAs doped with Zn at a concentration of $3\times10^{18}$ cm$^{-3}$ to have a thickness of 1.0 µm.

A wafer including a plurality of semiconductor layers thus grown is cooled approximately to a room temperature and taken out from the deposition chamber. On the obtained wafer, a silicon oxide film in the form of a stripe (not shown) is used as a mask and RIE is employed to form a ridged stripe. More specifically, $Cl_2$ gas is used to etch from p-type contact layer 611 to some extent of p-type clad layer 610 or to some extent of p-type guide layer 609, thereby forming a ridged stripe 614 having a top stripe-width of 3 µm on the upper surface of p-type electrode and a bottom stripe-width of 4 µm.

Then, with the mask of silicon oxide film held, the wafer is again set in a crystal growth apparatus. At a substrate temperature of 720° C., hydrogen serving as a carrier gas, TMG and arsine serving as source gases, and silane serving as a dopant gas are used to selectively grow an n-type GaAs current constriction layer 615 of 1.0 µm thickness.

After the wafer is cooled approximately to a room temperature, the silicon oxide film used as the mask for the selective growth is removed and then a p-type electrode 612 of zinc/gold is formed on exposed p-type contact layer 611 at the top of ridged stripe 614.

Then, n-type GaAs substrate 601 has its back surface ground and polished to have a thickness of 90 µm and thereafter an n-type electrode 613 is formed on the back surface. Then, alloying of the electrode is carried out in a vacuum at 450° C. for three minutes. Then, a p-type pad electrode 616 of molybdenum and gold is formed to cover p-type electrode 612 and current constriction layer 615 at least in the vicinity of both side of electrode 612. Finally, the wafer is cleaved to form end surfaces of a cavity and then divided into chips to produce semiconductor laser devices. Incidentally, the cavity preferably has a length in a range of 180 to 850 μm.

The obtained laser device is die-bonded to a heat sink and p-type pad electrode 616 is wire-bonded. The laser devise is energized to lase at a room temperature, and continuous lasing is confirmed with a threshold current of 450 Acm$^{-2}$, a threshold voltage of 1.7V and an emission wavelength of 895 nm. Furthermore, the laser device having its lifetime of at least 20,000 hours at 85° C. is obtained with a yield rate of 80%.

Figure 7:
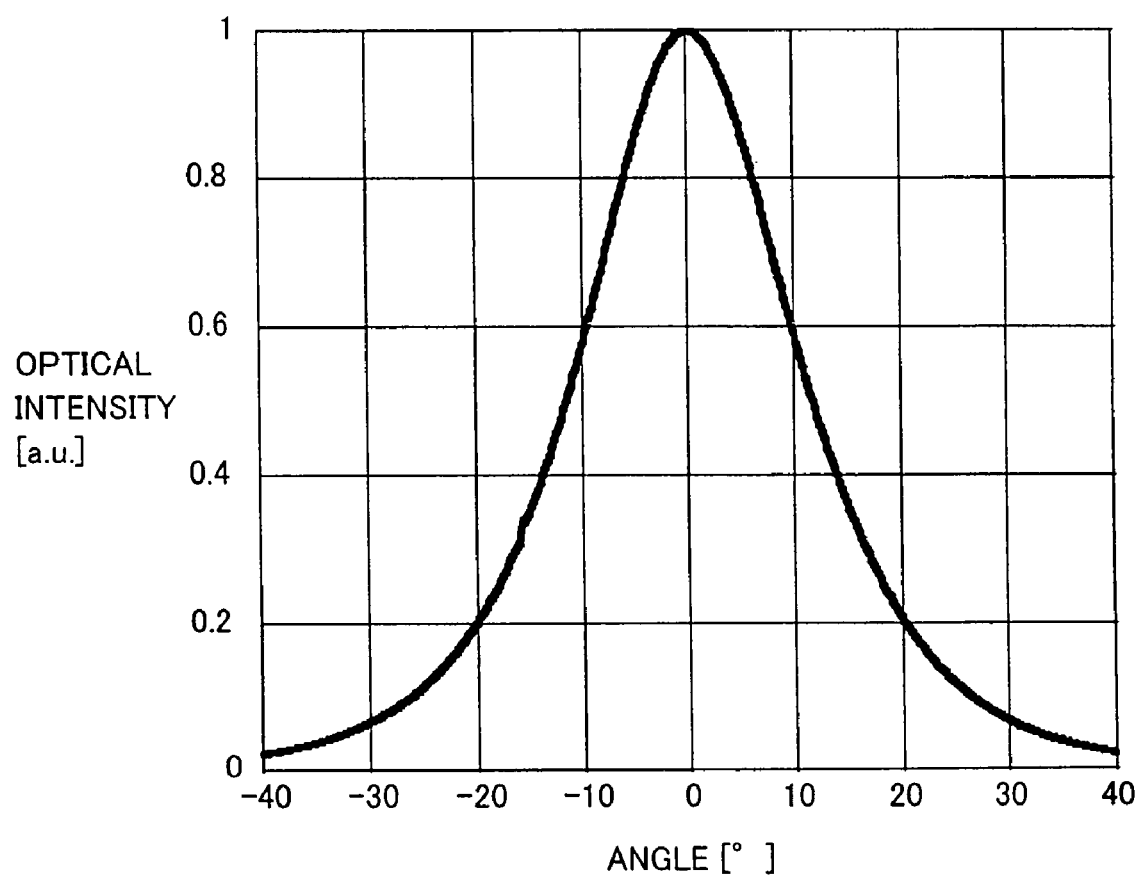
FIG. 7 is a graph showing an optical intensity profile of a vertical radiation pattern of the FIG. 6 semiconductor laser device.

FIG. 7 shows a vertical radiation pattern in an FFP of the laser device provided in the eighth embodiment. As seen in FIG. 7, the eighth embodiment substantially completely eliminates such a conventional noise peak as shown in FIG. 16. Furthermore in the present embodiment, the full angle at half maximum of the vertical radiation pattern in the FFP can be reduced to 23°, and thus it has a small ratio of 2.3 relative to 10° of the full angle at half maximum of the horizontal radiation pattern in the same FFP. With the laser device of the eighth embodiment, therefore, it is possible to improve efficiency of using laser light in collecting the laser light by a lens.

Ninth Embodiment

Figure 8:
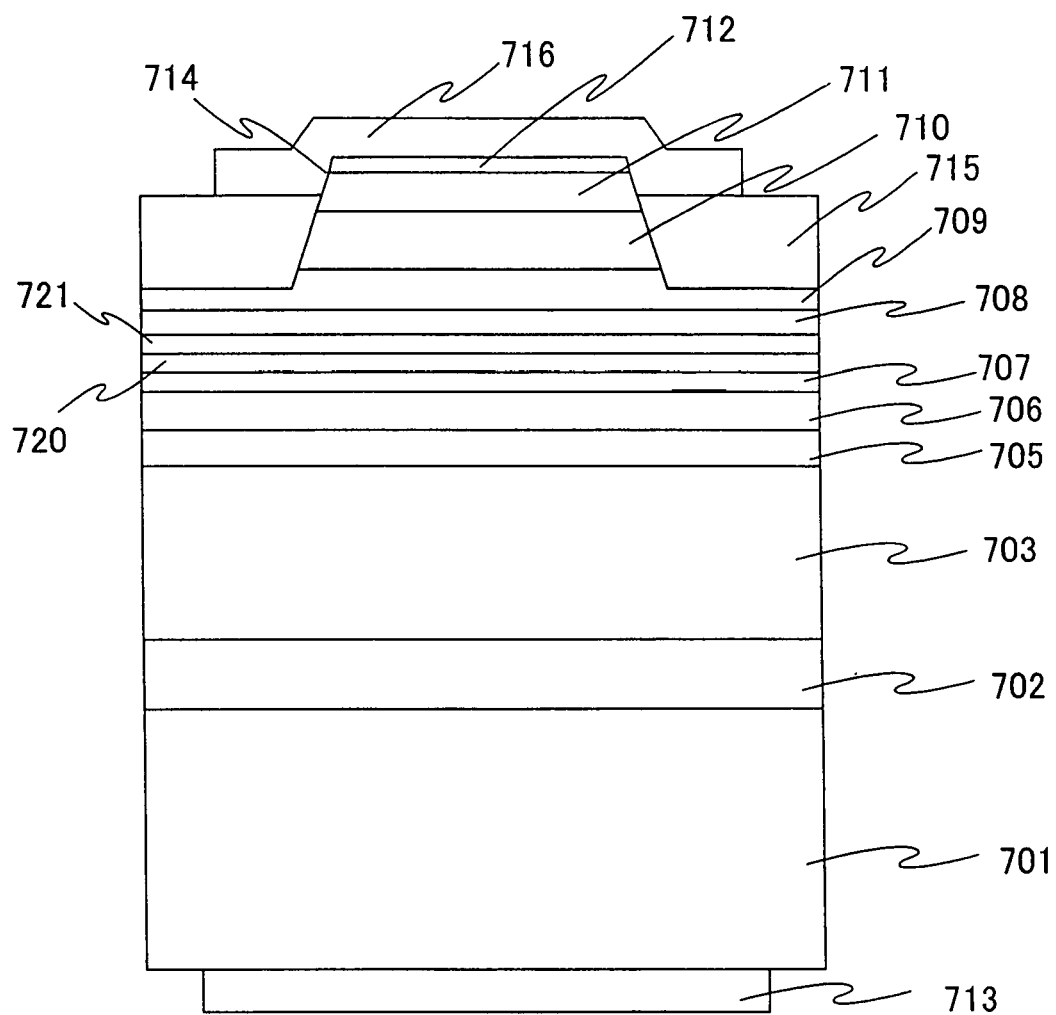
FIG. 8 is a schematic front view of a semiconductor laser device according to a ninth embodiment of the present invention.

FIG. 8 is a schematic front view of a laser device provided by a ninth embodiment. This laser device includes n-type clad layers whose refractive indexes are continuously changed in the thickness direction. This laser device is fabricated as follows: initially, on an n-type GaN substrate 701 at 1125° C., hydrogen serving as a carrier gas, TMG and ammonium serving as source gases, and silane serving as a dopant gas are used to grow an n-type GaN underlying layer 702 to a thickness of 3 μm.

Then, at the same substrate temperature, hydrogen serving as a carrier gas, TMA, TMG and ammonium serving as source gases, and silane serving as a dopant gas are used to grow a first n-type clad layer 703 of Al$_x$Ga$_{1-x}$As doped with Si at a concentration of 3×10$^{18}$ cm$^{-3}$ to have a thickness of 2.5 μm. Herein, first n-type clad layer 703 has an Al composition ratio x equal to zero at the lower interface and monotonously increased to 0.12 at the upper interface. Note that while Al composition ratio x is linearly changed to increase in proportion to the layer's thickness in the ninth embodiment, x may be increased as a quadratic of the layer's thickness or may be increased stepwise.

Then, at the same substrate temperature, with a second clad layer being omitted, the same types of gases are used to grow a third n-type Al$_y$Ga$_{1-y}$N clad layer 705 doped with Si at a concentration of 3×10$^{18}$ cm$^{-3}$ to have a thickness of 0.3 μm. Herein, third n-type clad layer 705 has an Al composition ratio y equal to 0.12 at the lower interface (the interface with first n-type clad layer 703) and monotonously decreased to zero at the upper interface.

Figure 9:
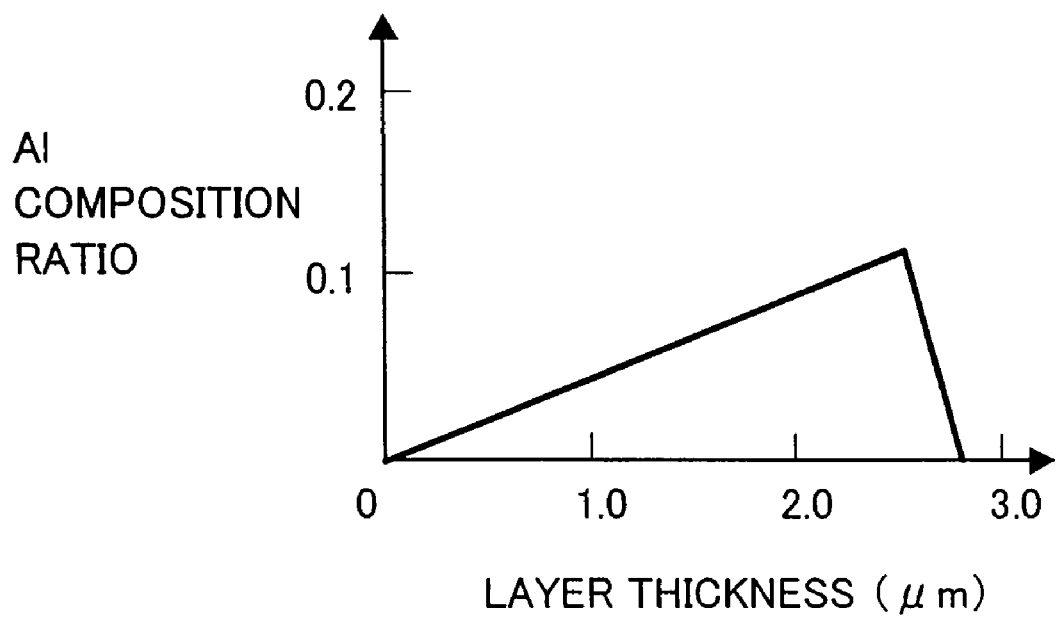
FIG. 9 is a graph schematically showing an exemplary variation of Al composition ratio in a thickness direction of a first conductivity type clad layer shown in FIG. 8.

FIG. 9 is a graph showing a variation of the Al composition ratio in the thickness direction of n-type clad layers 703 and 705 in the ninth embodiment. In this graph, a horizontal axis represents the thickness (micrometers) from the bottom surface of n-type clad layer 703 and a vertical axis represents the Al composition ratio. Note that first and third n-type clad layers 703, 705 have their respective Al composition ratios continuously changed to a maximum value at a region in the vicinity of the interface between first and third n-type clad layers 703, 705. Since that region functions as a second n-type clad layer, it is not necessary to form another layer serving as the second clad layer. In the ninth embodiment, therefore, it is important that n-type clad layers 703, 705 are formed to provide at least three regions having high, low and high refractive indexes, respectively, in a direction from substrate 701 toward an active layer 707.

Furthermore, at the same substrate temperature, hydrogen serving as a carrier gas, TMG and ammonium serving as source gases, and silane serving as a dopant gas are used to grow an n-type guide layer 706 of GaN doped with Si at a concentration of 8×10$^{17}$ cm$^{-3}$ to have a thickness of 0.13 μm.

Then, at the substrate temperature reduced to 780° C., nitrogen or argon serving as a carrier gas, TMG and ammonium serving as sources gases, and silane serving as a dopant gas are used to grow a barrier layer of GaN doped with Si at a concentration in a range of 1×10$^{19}$ to 3×10$^{20}$ cm$^{-3}$ to have a thickness of 10 nm. Then, the silane is stopped and TMI is additionally introduced to grow a well layer of undoped In$_{0.1}$Ga$_{0.9}$N to a thickness of 3 nm. These barrier and well layers are repeatedly deposited three times and thereafter a final barrier layer is grown to complete active layer 707 including a multiple quantum well structure (MQW) having a total thickness of 49 nm.

Then, at the same substrate temperature, silane, TMG and ammonium are used to deposit an n-type GaN band adjustment layer 720 to a thickness of 7 nm. Furthermore, TMG and ammonium are used to deposit an undoped GaN intermediate layer 721 to a thickness of 70 nm. Then, hydrogen serving as a carrier gas, TMA, TMG and ammonium serving as source gases, and Cp$_2$Mg serving as a dopant gas are used to grow a p-type protection layer 708 of Al$_{0.15}$Ga$_{0.85}$N doped with Mg at a concentration of 2×10$^{20}$ cm$^{-3}$ to have a thickness of 12 nm.

Furthermore, at the substrate temperature raised to 1035° C., nitrogen serving as a carrier gas, TMG and ammonium serving as source gases, and Cp$_2$Mg serving as a dopant gas are used to grow a p-type guide layer 709 of GaN doped with Mg at a concentration of 2×10$^{19}$ cm$^{-3}$ to have a thickness of 0.08 μm. Then, at the same substrate temperature, nitrogen serving as a carrier gas, TMA, TMG and ammonium serving as sources gases, and further CP$_2$Mg serving as a dopant gas are used to grow a p-type Al$_{0.07}$Ga$_{0.93}$N clad layer 710 doped with Mg at a concentration of 9×10$^{19}$ cm$^{-3}$ to have a thickness of 0.5 μm. Furthermore, at the same substrate temperature, nitrogen serving as a carrier gas, TMG and ammonium serving as source gases, and Cp$_2$Mg serving as a dopant gas are used to grow a p-type contact layer 711 of GaN doped with Mg at a concentration of 1.5×10$^{20}$ cm$^{-3}$ to have a thickness of 60 nm.

A wafer including a plurality of semiconductor layers thus grown is cooled approximately to a room temperature and taken out from the deposition chamber. A p-type electrode layer 712 of palladium/molybdenum/gold is formed so as to cover p-type contact layer 711 of the wafer. Then, a resist mask (not shown) is formed on p-type electrode 712 and RIE is employed to form a ridged stripe. More specifically, Ar gas is used to etch p-type electrode 712 and furthermore a gaseous mixture of Ar, Cl$_2$ and SiCl$_4$ is used to etch from p-type contact layer 711 to same extent of p-type clad layer 710 or to some extent of p-type guide layer 709, thereby forming a ridged stripe 714 having a top stripe-width of 1.6 μm on the upper surface of p-type electrode 712 and a bottom stripe-width of 1.8 μm.

Furthermore, with ridged stripe 714 having the resist left thereon, the wafer's top surface is covered with an insulating film 715 (herein, silicon oxide) grown to a thickness of 0.2 μm. Thereafter, the resist is removed to expose the top surface of ridged stripe 714.

Then, n-type GaN substrate 701 has its back surface ground and polished to have a thickness of 130 μm. Thereafter, an n-type electrode 713 of metal containing hafnium and aluminum is formed on the back surface of the substrate. Then, alloying of the electrode is carried out at 480° C. for about two minutes. Then, a p-type pad electrode 716 made of molybdenum and gold is formed to cover p-type electrode 712 overlying ridged stripe 714 as well as insulating film 715 at least in the vicinity of either side of the electrode. Finally, broken-line scribing is employed to cleave the wafer to form cavity's end surfaces and thereafter it is divided into chips to produce semiconductor laser devices. Incidentally, the cavity preferably has a length in a range of 180 to 850 μm.

The obtained laser device is die-bonded to a heat sink and p-type pad electrode 716 is wire-bonded. The laser devise is energized to lase at a room temperature, and continuous lasing is confirmed with a threshold current of 2.1 kAcm$^{-2}$, a threshold voltage of 4.2V and an emission wavelength of 400 nm. Furthermore, the laser device has its lifetime of at least 20,000 hours at 80° C.

FIG. 9 shows a profile of a variation in Al composition ratio in the thickness direction of n-type clad layers 703 and 705. By gradually changing the Al composition ratios of the n-type clad layers in this manner, cracking in the AlGaN layer can more effectively be prevented as compared to the first embodiment, and the yield rate of the laser device can be increased.

The full width at half maximum of a vertical radiation pattern in an FFP of the laser device of the ninth embodiment is as small as 16°, and it is possible to effectively suppress the noise peak attributed to light radiated into substrate 701. Furthermore, the laser device of the ninth embodiment gives 10.5° for the full width at half maximum of the horizontal radiation pattern in the FFP, and thus can provide the ellipticity as small as 1.5. Therefore, the present embodiment's laser device can effectively be used in a pickup for a optical disk, thereby omitting a beam shaping prism to allow miniaturization and production at reduced costs.

Figure 10:
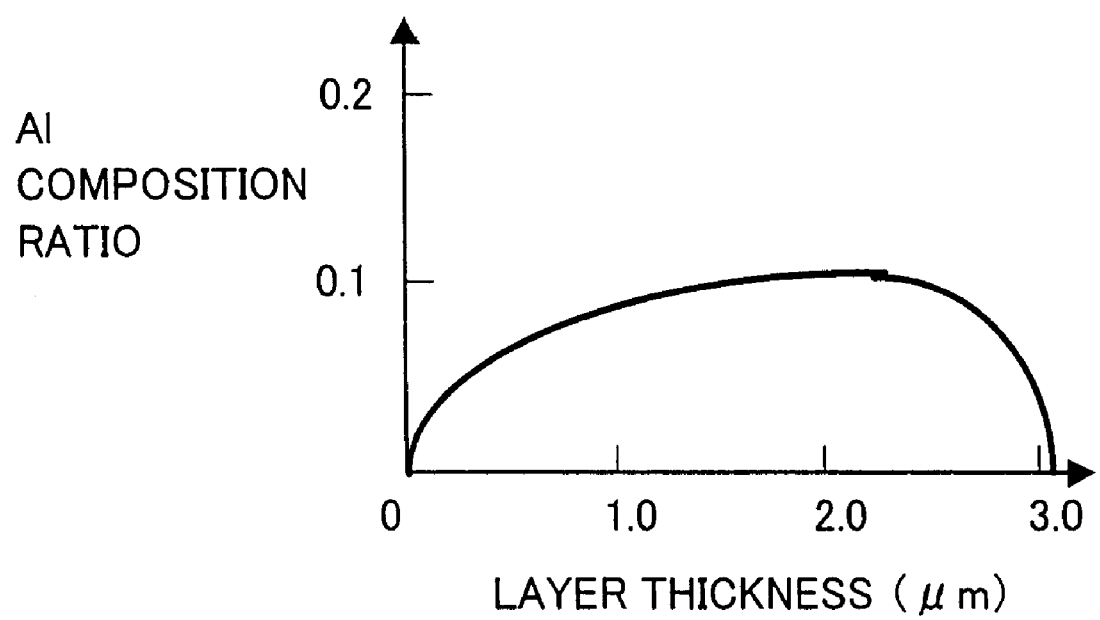
FIG. 10 is a graph schematically showing another exemplary variation of Al composition ratio in a thickness direction of a first conductivity type clad layer in the ninth embodiment.
Figure 11:
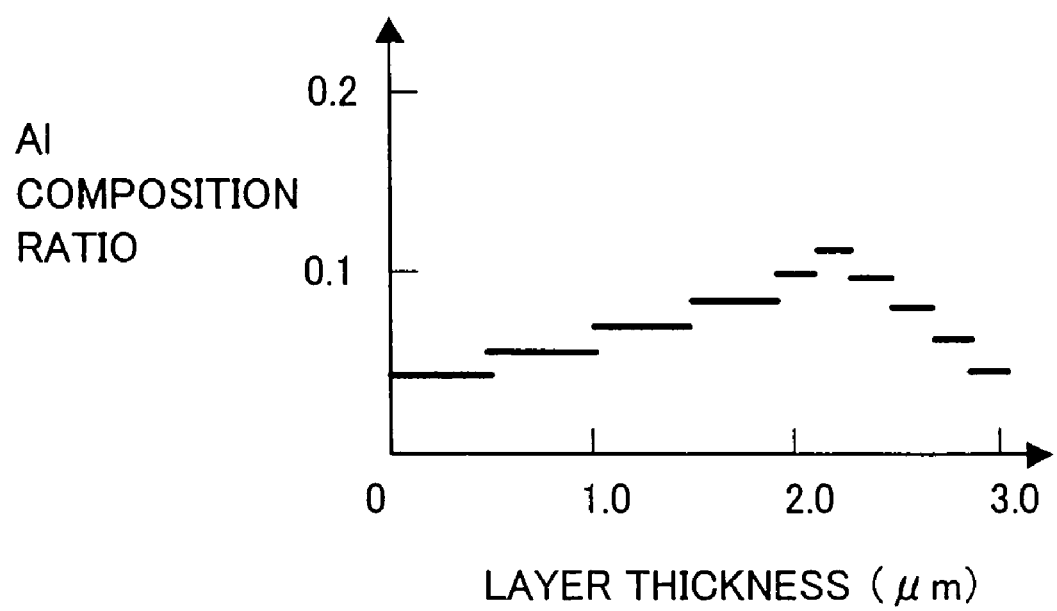
FIG. 11 is a graph schematically showing still another exemplary variation of Al composition ratio in a thickness direction of a first conductivity type clad layer in the ninth embodiment.
Figure 12:
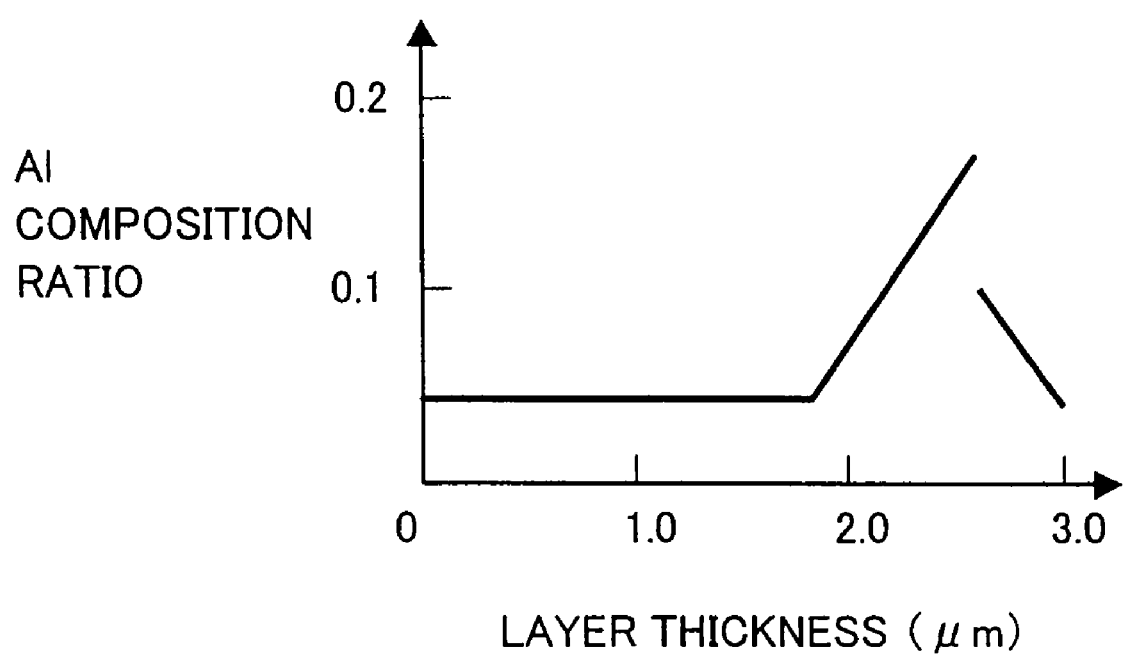
FIG. 12 is a graph schematically showing still another exemplary variation of Al composition ratio in a thickness direction of a first conductivity type clad layer in the ninth embodiment.

In the ninth embodiment, as shown in FIG. 9, the Al composition ratios x and y are changed linearly depending on the thickness. However, the Al composition ratio's variation profile may be a quadric, stepwise, or the like. For example, such composition ratio profiles as exemplified in FIGS. 10-12 can also be expected to achieve the present invention's effects.

As described in the ninth embodiment, to reduce cracks in the AlGaN clad layer by changing the Al composition ratio continuously or stepwise between the active layer and the transparent substrate having a refractive index higher than the waveguide's effective refractive index, it is important that the clad layers between active layer 707 and substrate 701 have a total thickness $d_t$ in a range of 1.4 μm$\leq d_t \leq$4.5 μm. It should be noted in this case that the portion of thickness $d_t$ functioning as the clad layer is only a portion having a refractive index smaller than the waveguide's effective refractive index. In the case of FIG. 9, for example, a region having the Al ratio of the mixed-crystal exceeding 0.04 is the portion functioning as the clad layer, and has thickness $d_t$ of 1.8 μm.

Furthermore, by setting a range of 0.06$\leq x_{max} \leq$0.35 for an Al composition ratio $x_{max}$ of a portion of the clad layer that has the smallest refractive index (the highest Al composition ratio) between active layer 707 and substrate 701, it become possible to reduce cracks in the clad layer and effectively reduce the radiation mode into substrate 701. Furthermore, by setting the center of the portion having $x_{max}$ in the clad layer to be at a position upper by more than $2d_t/3$ in the thickness direction from the bottom surface of the clad layer, the full width at half maximum of the vertical radiation pattern in the FFP can be made smaller than 21°.

In the ninth embodiment, the refractive index is continuously changed to realize the function similar to the clad layer formed of three sublayers. In this embodiment, first n-type clad layer 703, the third n-type clad layer 705 or the interface therebetween may include an inserted thin layer having a thickness of one fourth or less of the laser wavelength in the waveguide (in the present embodiment, a thickness of 0.04 μm or less) and also having a refractive index different from those of the overlying and underlying adjacent clad layers. More specifically, a crack prevention layer of GaN having a thickness in a range of 0.005 μm to 0.04 μm may be inserted at the interface between first and third n-type clad layers 703 and 705, or a buffer layer of GaN having a thickness in a range of 0.01 μm to 0.04 μm may be inserted in first n-type clad layer 703.

While in the ninth embodiment a graded junction is realized by continuously changing the Al composition ratio by way of an example, it is of course possible to obtain the present invention's effects with a clad layer having a superlattice structure formed of many stacked layers including GaN and AlGaN layers with their ratio in thickness gradually changed.

Tenth Embodiment

Figure 13:
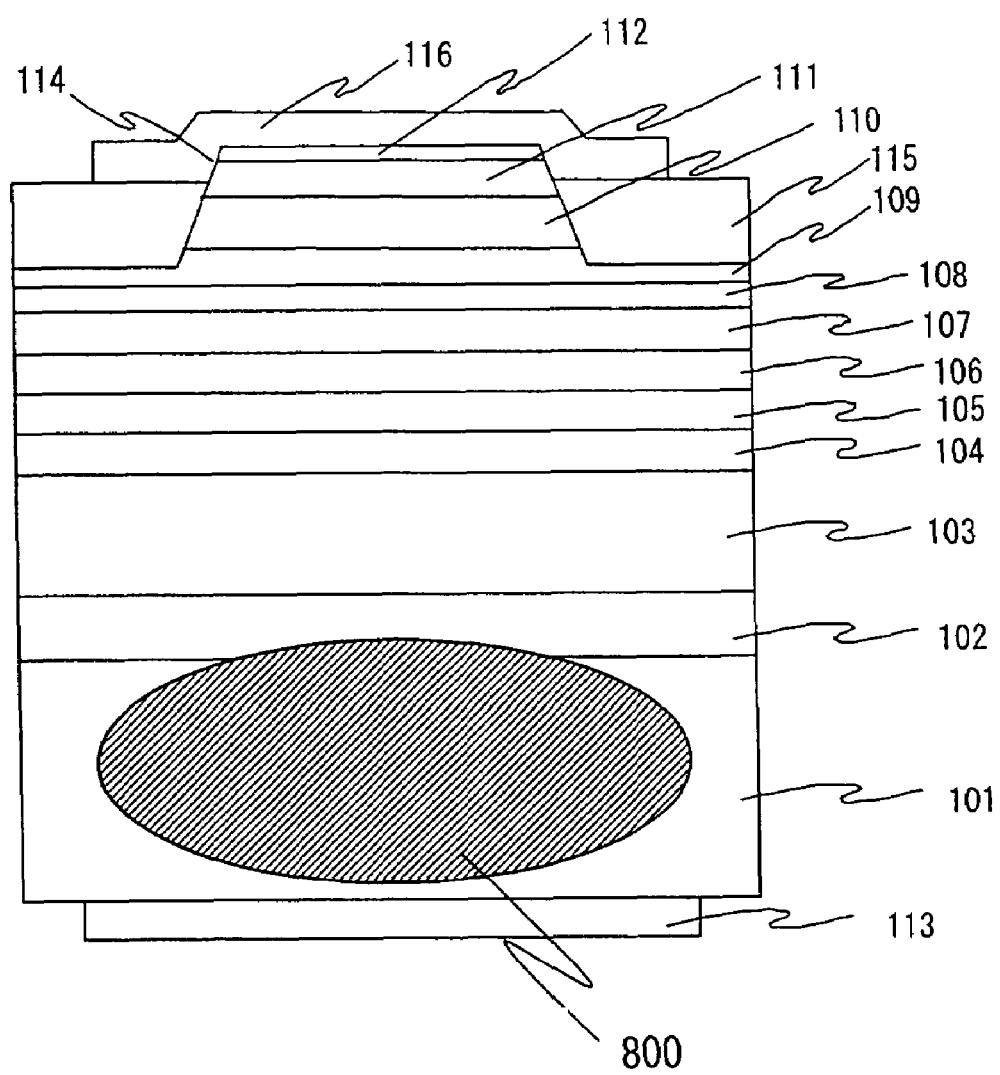
FIG. 13 is a schematic front view of a semiconductor laser device according to a tenth embodiment of the present invention.

FIG. 13 is a schematic front view of a laser device provided by a tenth embodiment. This laser device is different from the first embodiment only in that a portion lower than the first n-type clad layer 103 on the light emitting end surface is provided with an optical absorber film 800. Optical absorber film 800 can prevent light from emanating from the laser device through underlying GaN layer 102 and GaN substrate 101 and negatively affecting the FFP. Furthermore, optical absorber film 800 can also reduce an effect of a radiation mode (a leakage mode) on the FFP even in a semiconductor stacked-layer structure in which the radiation mode still remains more or less, and thus the full width at half maximum of the vertical radiation pattern in the FFP can be further narrower than in the first embodiment. Note that optical absorber film 800 may be formed of any metal or resin that can absorb laser light.

Figure 14:
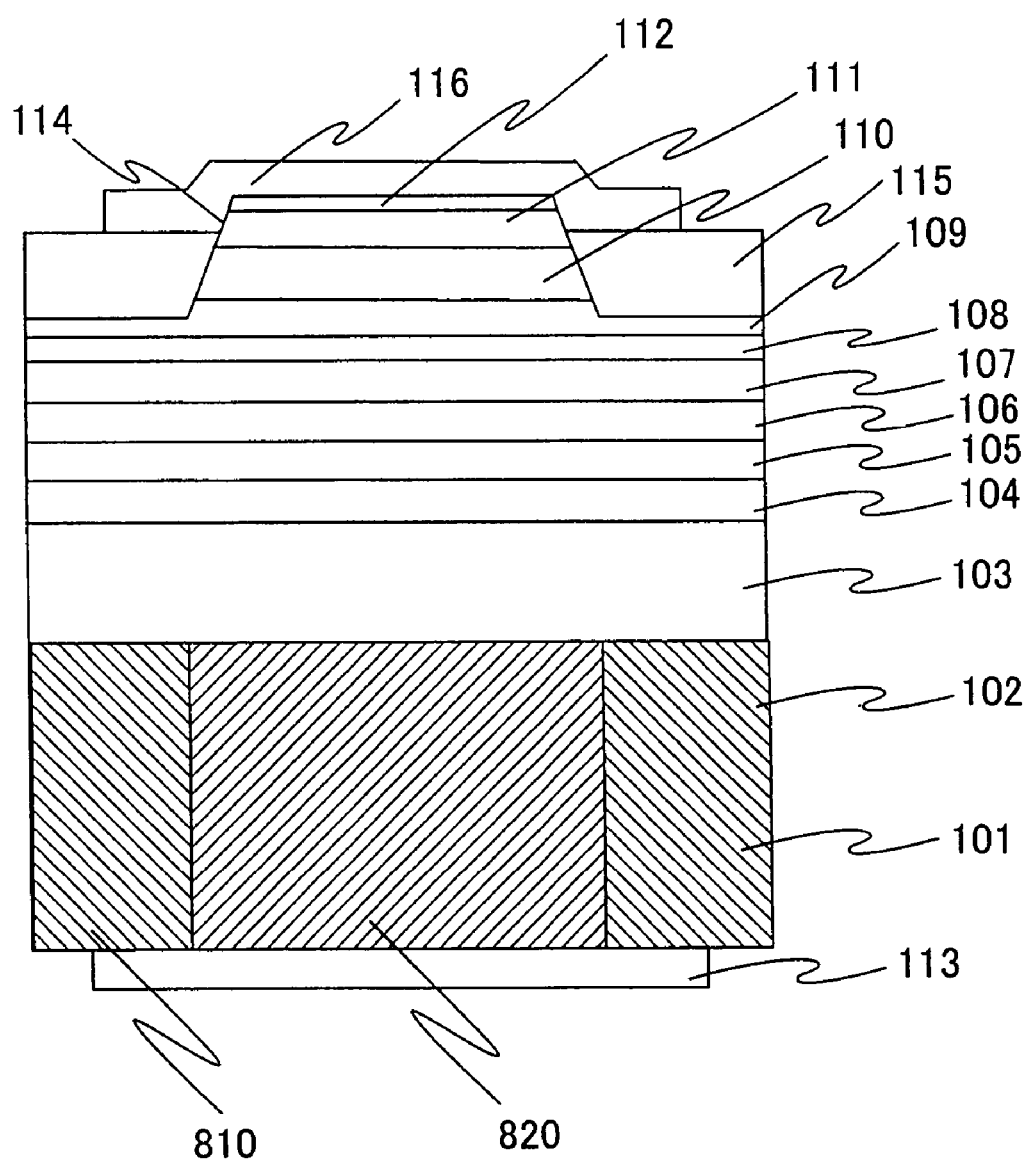
FIG. 14 is a schematic front view for illustrating a radiation region of a leakage mode and a portion immediately underlying a waveguide in the tenth embodiment.
Figure 15:
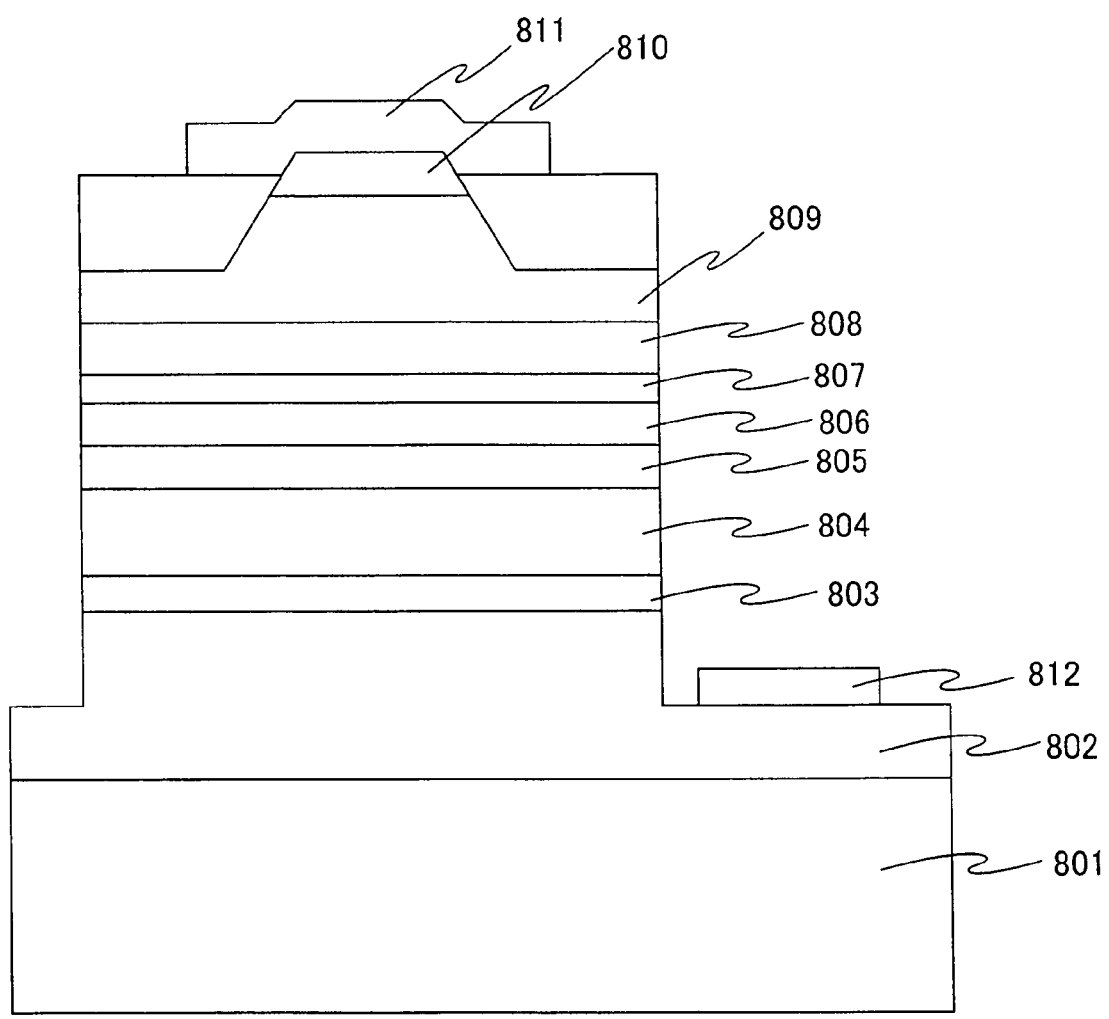
FIG. 15 is a schematic front view of a semiconductor laser device provided by conventional art.

Furthermore, as shown in FIG. 14, optical absorber film 800 is formed in a range preferably covering a 35% or more area of a noise light radiation region 810 below first n-type clad layer 103 on the light emitting end surface. More preferably, in noise light radiation region 810, a portion 820 just underlying the ridged stripe (or the waveguide) is covered by 60% or more with optical absorber film 800. Optical absorber film 800 thus arranged can reduce the negative effect of the radiation mode on the FFP. Furthermore, the film can also prevent light externally directed to the end surface of substrate 101 from being reflected by the end surface or entering substrate 101, thereby causing an effect of eliminating unwanted light in an optical system such as an optical pickup.

The laser device of the tenth embodiment exhibits such an effect for example in an optical pickup in an optical disk apparatus in which a 3-beam method is used for generating a tracking signal. By forming optical absorber film 800 on a region including positions on the end surface of substrate 101 which are illuminated with returned sub-beams of the three beams, it becomes possible to eliminate a tracking signal noise attributed to interference of the returned sub-beams and the radiation mode light radiated from the laser device's interior through the substrate 101 end surface.

Eleventh Embodiment

An eleventh embodiment is different from the tenth embodiment only in that optical absorber film 800 is replaced with an optical reflective film. In the eleventh embodiment, it is also possible to obtain similar effects as in the tenth embodiment. In the eleventh embodiment, the optical reflector film should also be formed on the same region as optical absorber film 800 is formed in the tenth embodiment.

Furthermore, the reflective film can be a metal film or a multilayer dielectric film having a laser light transmittance of 50% at most. More specifically, the end surface of the laser device may have a region provided with a dielectric film and then Al, Au, Pt, Ni or a similar metal film having a thickness of 10 nm or more deposited on the dielectric film by evaporation, or with a multi-layer dielectric film including four $SiO_2$ and $TiO_2$ layers deposited so as to have a reflectance adjusted to 50-70%.

INDUSTRIAL APPLICABILITY

According to the present invention, in a semiconductor laser device including a transparent substrate having a refractive index larger than an effective refractive index of its waveguide, it is possible to significantly reduce radiation loss into the substrate by selecting material and thickness of a clad layer between the substrate and an active layer so as to satisfy a prescribed refractive index relationship. As a result, it becomes possible to realize a semiconductor laser device having a small threshold current and excellent reliability. Furthermore, according to the present invention, in a semiconductor laser device, it is possible to effectively preventing cracks from occurring in crystals thereby improving production yields and also reducing radiation loss into the substrate.

The invention claimed is:

1. A nitride semiconductor laser device having a waveguide constructed in a stack of layers including, a first conductivity type clad layer, a first conductivity type guide layer of a refractive index $n_g$, an active quantum well layer, a second conductivity type guide layer, and a second conductivity type clad layer deposited in this order on a substrate of GaN or AlGaN with an Al composition ratio of less than 0.02 and having a refractive index $n_s$ for laser light, wherein:

said optical waveguide has an effective refractive index $n_e < n_s$, $n_g$, said first conductivity type clad layer includes a first region, a second region, and a third region in this order in its thickness direction, said second region having an Al composition ratio larger than said first and third regions, and then said first, second and third regions all having their respective refractive indexes smaller than $n_e$, and said first region has a thickness of $d_{c1}$, said second region has a thickness of $d_{c2}$ and said third region has a thickness of $d_{c3}$, and then $d_{c2} < d_{c1}$, $d_{c3} < d_{c1}$ and $1.4\ \mu m \leq d_{c1} + d_{c2} + d_{c3} \leq 4.5\ \mu m$ are satisfied.

2. The nitride semiconductor laser device of claim 1, wherein in said second region, a maximum Al composition ratio $X_{max}$ is in a range of $0.06 \leq X_{max} \leq 0.35$.

3. The nitride semiconductor laser device of claim 1, wherein a portion having the maximum Al composition ratio $X_{max}$ in said second region in said first conductivity type clad layer of a thickness $d_t$ is located at a position farther than $2d_t/3$ in a direction from said substrate toward said active layer.

4. The semiconductor laser device of claim 1, wherein on a laser beam emitting end surface, one of an optical absorber film and an optical reflective film is formed on an optical radiation region below said first conductivity type clad layer.

5. The semiconductor laser device of claim 4, wherein said optical absorber film or said optical reflective film is formed on at least 35% area of said optical radiation region.

6. The semiconductor laser device of claim 4, wherein in said optical radiation region, said optical absorber film or said optical reflective film is formed on a portion of at least 65% of an area located below said waveguide.

7. The semiconductor laser device of claim 4, wherein said optical reflective film has an optical transmittance of at most 50%.

* * * * *